United States Patent [19]

Takeuchi et al.

[11] Patent Number: 5,767,612
[45] Date of Patent: Jun. 16, 1998

[54] PIEZOELECTRIC/ELECTROSTRICTIVE FILM ELEMENT WITH A DIAPHRAGM HAVING AT LEAST ONE STRESS RELEASING END SECTION

[75] Inventors: Yukihisa Takeuchi, Aichi-ken; Tsutomu Nanataki, Toyoake, both of Japan

[73] Assignee: NGK Insulators, Ltd., Japan

[21] Appl. No.: 574,347

[22] Filed: Dec. 18, 1995

[30] Foreign Application Priority Data

Dec. 21, 1994 [JP] Japan ................. 6-318080

[51] Int. Cl.⁶ .................................................. H01L 41/08
[52] U.S. Cl. ............................ 310/324; 310/330; 310/346
[58] Field of Search ............................ 310/328, 324, 310/330–332, 358, 359, 369, 371, 346

[56] References Cited

U.S. PATENT DOCUMENTS

| | | | |
|---|---|---|---|
| 2,549,872 | 4/1951 | Willard | 310/371 |
| 3,349,259 | 10/1967 | Kistler | 310/346 X |
| 3,621,154 | 11/1971 | Kogen | 310/324 X |
| 3,828,210 | 8/1974 | Livenick et al. | 310/346 |
| 4,190,782 | 2/1980 | Guess | 310/324 |
| 4,635,079 | 1/1987 | Hubbard | 346/140 R |
| 4,641,054 | 2/1987 | Takahata et al. | 310/324 |
| 5,089,455 | 2/1992 | Ketcham et al. | 501/104 |
| 5,113,108 | 5/1992 | Yamashita et al. | 310/328 |
| 5,126,615 | 6/1992 | Takeuchi et al. | 310/330 |
| 5,210,455 | 5/1993 | Takeuchi et al | 310/328 |
| 5,250,868 | 10/1993 | Shirasu | 310/346 X |
| 5,430,344 | 7/1995 | Takeuchi et al. | 310/330 |
| 5,594,292 | 1/1997 | Takeuchi et al. | 310/324 |
| 5,600,197 | 2/1997 | Takeuchi et al. | 310/328 |

FOREIGN PATENT DOCUMENTS

| | | |
|---|---|---|
| 0629007 | 12/1994 | European Pat. Off. .......... 310/330 |
| 760-111600 | 6/1985 | Japan . |
| 62-213399 | 9/1987 | Japan . |
| 3-128681 | 5/1991 | Japan . |
| 5-49270 | 2/1993 | Japan . |
| 2161647 | 1/1986 | United Kingdom . |

*Primary Examiner*—Mark O. Budd
*Attorney, Agent, or Firm*—Parkhurst & Wendel, LLP

[57] ABSTRACT

A piezoelectric and/or electrostrictive film element including a ceramic substrate, and a piezoelectric or electrostrictive unit formed on the substrate and including a piezoelectric or electrostrictive layer between lower and upper electrodes. The substrate has a window closed by a diaphragm portion. The unit is disposed on the diaphragm portion such that at least one of the opposite ends of the unit is spaced apart from the edge of the window in a direction toward the center of the diaphragm portion. The end part of the diaphragm portion spaced apart from the edge of the window is upwardly convexed or downwardly concaved to provide a stress releasing section for effectively converting stresses generated in the piezoelectric or electrostrictive unit into displacement of the diaphragm portion. Also disclosed are methods for forming the stress releasing section by firing the unfired piezoelectric/electrostrictive layer formed on the diaphragm portion of the fired ceramic substrate.

6 Claims, 13 Drawing Sheets

5,767,612

PIEZOELECTRIC/ELECTROSTRICTIVE FILM ELEMENT WITH A DIAPHRAGM HAVING AT LEAST ONE STRESS RELEASING END SECTION

BACKGROUND OF THE INVENTION

1. Field of the Invention

The present invention relates to a uni-morph, bi-morph or other type of piezoelectric and/or electrostrictive film element which generates or detects displacement or force in the form of bending, deflection or flexure, and which can be used for actuators, filters, display devices, transformers, microphones, sounding bodies (such as loudspeakers), various resonators, oscillators, or vibrators, discriminators, gyros, sensors and other components and devices. The present invention is also concerned with a method for producing such piezoelectric or electrostrictive film elements. The term "element" used herein means an element which is capable of transducing or converting an electric energy into a mechanical energy, i.e., mechanical displacement, strain or vibrations, or converting a mechanical energy into an electric energy.

2. Discussion of the Related Art

In recent years, in the fields of optics and precision positioning or machining operations, there has been an increasing demand for an element whose displacement is controlled for adjusting or controlling an optical path length or a position of a member or component of a device, on the order of fractions of a micron (μm), and a detecting element adapted to detect infinitesimal displacement of a subject as an electric change. To meet the demand, there have been developed piezoelectric and/or electrostrictive film elements (hereinafter referred to as "P/E film elements") used for actuators or sensors, which elements comprise a piezoelectric material such as a ferroelectric material, and utilize the reverse or converse piezoelectric effect to produce a mechanical displacement upon application of an electric field to the piezoelectric material, or utilize the piezoelectric effect to produce an electric field upon application of a pressure or mechanical stress. Among these elements, a conventional uni-morph type P/E film element has been favorably used for a loudspeaker, for example.

There have been proposed ceramic P/E film elements used for various purposes, as disclosed in JP-A-3-128681 (i.e., in the co-pending U.S. patent applications Ser. Nos. 07/550, 977, 07/860,128, 08/102,960, 08/384,469, 08/392,083 and 08/452,092) and in JP-A-5-49270 (i.e., in U.S. Pat. No. 5,210,455 and U.S. patent application Ser. No. 08/013,046), which were filed by the assignee of the present invention. One example of the disclosed elements has a ceramic substrate which has at least one window, and is formed integrally with a thin diaphragm which closes the window or windows so as to provide at least one thin-walled diaphragm portion or vibratile portion. On an outer surface of each diaphragm portion of the ceramic substrate, there is formed a piezoelectric/electrostrictive unit (hereinafter referred to as "P/E unit") which is an integral laminar structure consisting of a lower electrode, a piezoelectric/electrostrictive layer (hereinafter referred to as "P/E layer") and an upper electrode. The P/E unit is formed by a suitable film-forming method or process on the corresponding diaphragm portion of the ceramic substrate. The thus formed P/E film element is relatively small-sized and inexpensive, and can be used as an electromechanical transducer having high reliability. Further, this element has a high operating response, and provides a relatively large amount of displacement by application of a low voltage, with a relatively large magnitude of force being generated. Thus, the above-described element is favorably used as a member for an actuator, filter, display device, sensor or other components or devices.

To produce the P/E film element as described above, the lower electrode, P/E layer and upper electrode of each P/E unit are laminated in this order on the diaphragm portion of the ceramic substrate by a suitable film-forming method, and is subjected to heat treatment (firing or sintering) as needed, so that the P/E unit is formed integrally on the diaphragm portion. A further study of the inventors of the present invention revealed that the piezoelectric/electrostrictive characteristics of the element are deteriorated due to the heat treatment (firing or sintering) effected during the formation of the P/E unit, more specifically, the P/E layer.

Described in detail, the P/E layer suffers from stresses due to firing shrinkage of the P/E layer or P/E unit which is in contact with the diaphragm portion of the ceramic substrate, during the heat treatment of the P/E layer. The stresses remain therein after the firing, and prevent the P/E film element from having a sufficiently dense sintered structure. In this case, the P/E film element can not exhibit desired or intended piezoelectric/electrostrictive characteristics. The residual stresses after the firing of the P/E layer undesirably deteriorate the piezoelectric/electrostrictive characteristics, in particular, reduces an amount of displacement of the diaphragm portion generated upon actuation of the P/E unit.

To produce an actuator for a display device, for example, a plurality of windows are formed in a suitable pattern through a ceramic substrate, and P/E units as described above are formed on respective thin-walled diaphragm portions that close the corresponding windows. In this case, the amounts of displacement of the diaphragm portions may be considerably reduced due to the stresses remaining in the P/E layer after the firing thereof, particularly when two or more adjacent P/E units are actuated at the same time, as compared with the displacement amount where a single P/E unit is actuated. That is, when the two adjacent P/E units are actuated simultaneously, for example, the displacement of the diaphragm portion which carries one of the two P/E units interferes with that of the diaphragm portion which carries the other P/E unit, resulting in reduction of the amounts of displacement of these diaphragm portions. The reduction in the amounts of displacement of the diaphragm portions is serious where the spacing between the adjacent P/E units is reduced to meet a recent demand for a larger number of the P/E units per unit area.

SUMMARY OF THE INVENTION

It is therefore a first object of the present invention to provide a piezoelectric/electrostrictive film element in which each piezoelectric/electrostrictive unit is formed by a film-forming method on an outer surface of a thin-walled diaphragm portion of a ceramic substrate, and which piezoelectric/electrostrictive film element can efficiently convert stresses generated in the P/E unit into a large amount of displacement upon application of a relatively low voltage, and does not suffer from considerable reduction in the amount of displacement where two or more P/E units formed on respective diaphragm portions are actuated at the same time.

It is a second object of the invention to provide a method suitable for producing a piezoelectric/electrostrictive film element capable of exhibiting such excellent characteristics as described above.

The above-indicated first object may be attained according to a first aspect of the present invention which provides a piezoelectric/electrostrictive film element comprising: (a) a ceramic substrate including a base portion having at least one window, and a diaphragm portion formed as an integral part of the base portion and closing each of the at least one window; (b) a film-like piezoelectric/electrostrictive unit including a lower electrode, a piezoelectric/electrostrictive layer and an upper electrode, which are formed in the order of description on an outer surface of the diaphragm portion by a film-forming process, the piezoelectric/electrostrictive unit being disposed on the diaphragm portion such that at least one of opposite end faces of the piezoelectric/electrostrictive unit is spaced apart from a corresponding one of opposite portions of a periphery of each window in a direction toward a center of the diaphragm portion; and (c) a stress releasing section constituted by each of at least one of opposite end parts of the diaphragm portion which is located between said at least one of the opposite end faces of the piezoelectric/electrostrictive unit and the corresponding at least one of the opposite portions of the periphery of each window, the stress releasing section being curved with respect to a plane which includes a major surface of the base portion at which each window is closed by the diaphragm portion.

In the piezoelectric/electrostrictive film element constructed according to the present invention, the stress releasing section is formed at at least one of opposite end parts of the diaphragm portion of the ceramic substrate on which the piezoelectric/electrostrictive unit is not disposed. In the presence of the stress releasing section, the piezoelectric/electrostrictive unit is less likely to be influenced by a force received from the ceramic substrate, whereby the stresses generated in the piezoelectric/electrostrictive unit can be converted into displacement with high efficiency, while assuring a large amount of displacement of the diaphragm portion, upon application of a relatively low voltage to the piezoelectric/electrostrictive unit.

Further, where the film element is provided with a plurality of piezoelectric/electrostrictive units, the amounts of displacement of the piezoelectric/electrostrictive units are not substantially reduced even when these units are simultaneously actuated, as compared with the amount of displacement when each piezoelectric/electrostrictive unit is actuated alone. Thus, the present film element assures a substantially constant amount of displacement of each diaphragm portion, and substantially consistent operating characteristics of the film element, irrespective of the number of the piezoelectric/electrostrictive units which are simultaneously actuated.

According to a first preferred arrangement of the first aspect of the present invention, the opposite portions of the periphery of each window are opposed to each other in a direction parallel to a straight line which is parallel to the plane of the major surface of the base portion and passes a center of each window and along which each window has a shortest dimension. In this case, the dimension of the stress releasing section as measured in the direction is not greater than 40% of the shortest dimension of each window.

According to a second preferred arrangement of the first aspect of the invention, the diaphragm portion has at least one inflection point.

According to a third preferred arrangement of the first aspect of the invention, the stress releasing section includes an end part adjacent to the corresponding one of the opposite portions of the periphery of each window, the end part being curved protruding in a direction away from the plane of the major surface of the base portion.

According to a fourth preferred arrangement of the first aspect of the invention, the piezoelectric/electrostrictive unit is disposed such that both of the opposite end faces of the piezoelectric/electrostrictive unit are spaced apart from the corresponding opposite portions of the periphery of each window in the direction toward the center of the diaphragm portion. In this case, the stress releasing section is provided at each of the opposite end parts of the diaphragm portion located between the opposite end faces of the piezoelectric/electrostrictive unit and the corresponding opposite portions of the periphery of each window.

According to a fifth preferred arrangement of the first aspect of the invention, the piezoelectric/electrostrictive unit is disposed such that only one of the opposite end faces of the piezoelectric/electrostrictive unit is spaced apart from the corresponding one of the opposite portions of the periphery of each window in the direction toward the center of the diaphragm portion. In this case, the stress releasing section is provided at only one of the opposite end parts of the diaphragm portion located between the one of the opposite end faces of the piezoelectric/electrostrictive unit and the corresponding one of the opposite portions of the periphery of each window.

According to a sixth preferred arrangement of the first aspect of the invention, the stress releasing section has an upwardly convex shape, protruding from the plane in a direction away from each window.

According to one advantageous feature of the fourth preferred arrangement of the first aspect of the invention, the stress releasing section provided at each of the opposite end parts of the diaphragm portion has an upwardly convex shape, protruding from the plane in a direction away from each window, the diaphragm portion including a central part on which the piezoelectric/electrostrictive unit is formed, the central part having a downwardly concave shape, protruding from the plane in a direction toward each window.

According to one advantageous feature of the fifth preferred arrangement of the first aspect of the invention, the stress releasing section provided at only one of the opposite end parts of the diaphragm portion has an upwardly convex shape, protruding from the plane in a direction away from each window, a part of the diaphragm portion which includes the other of the opposite end parts and on which the piezoelectric/electrostrictive unit is formed having a downwardly concave shape, protruding from the plane in a direction toward each window.

According one advantageous feature of the sixth preferred arrangement of the first aspect of the invention, the ceramic substrate comprises a diaphragm plate which includes the diaphragm portion and which is formed on the major surface of the base portion such that the diaphragm portion closes each window. In this case, the upwardly convex shape of the stress releasing section has a height not greater than twice a thickness of the diaphragm portion. The height is measured from one of opposite major surfaces of the diaphragm plate which is remote from the base portion.

According to a seventh preferred arrangement of the first aspect of the invention, the stress releasing section has a downwardly concave shape, protruding in a direction toward each window.

According to one advantageous feature of the seventh preferred arrangement of the first aspect of the invention, the stress releasing section is provided on at least one of opposite sides of the piezoelectric/electrostrictive unit.

According to another advantageous feature of the seventh preferred arrangement of the first aspect of the invention, the ceramic substrate comprises a diaphragm plate which includes the diaphragm portion and which is formed on the major surface of the base portion such that the diaphragm portion closes each window. The downwardly concave shape of the stress releasing section has a height not greater than twice a thickness of the diaphragm portion. The height is measured from one of opposite major surfaces of the diaphragm plate which is remote from the base portion.

In the piezoelectric/electrostrictive film element constructed according to the present invention, the stress releasing section may have a corrugated shape having at least one upwardly convex part and at least one downwardly concave part. The diaphragm portion may have an average crystal grain size of not greater than 5 μm, and a thickness of not greater than 30 μm. The piezoelectric/electrostrictive unit may have a thickness of not greater than 100 μm.

The above-indicated second object of the invention may be attained according to a second aspect of the invention which provides a method of producing a piezoelectric/electrostrictive film element comprising: a ceramic substrate including a base portion having at least one window, and a diaphragm portion formed as an integral part of the base portion and closing each of the at least one window; and a film-like piezoelectric/electrostrictive unit including a lower electrode, a piezoelectric/electrostrictive layer and an upper electrode, which are formed in the order of description on an outer surface of the diaphragm portion by a film-forming process, the method comprising the steps of: preparing the ceramic substrate in which the diaphragm portion has an upwardly convex shape protruding in a direction away from each window; forming, by a film-forming process, at least the lower electrode and the piezoelectric/electrostrictive layer of the piezoelectric/electrostrictive unit, on the upwardly convex outer surface of the diaphragm portion such that at least one of opposite end faces of the unit is spaced apart from a corresponding one of opposite portions of a periphery of each window in a direction toward a center of the diaphragm portion; and firing the piezoelectric/electrostrictive layer such that a part of the diaphragm portion on which the piezoelectric/electrostrictive unit is formed is downwardly curved so as to have a downwardly concave shape protruding in a direction toward each window, while the at least one of opposite end parts of the diaphragm portion is upwardly curved so as to have an upwardly convex shape protruding in a direction away from each window, each of the at least one of opposite end parts of the diaphragm portion providing a stress releasing section.

The method of producing the piezoelectric/electrostrictive film element according to the present invention permits commercially advantageous manufacture of the film elements with improved efficiency.

According to a first preferred arrangement of the second aspect of the invention, the step of forming at least the lower electrode and the piezoelectric/electrostrictive layer comprises forming the lower electrode and the piezoelectric/electrostrictive layer such that both of the opposite end faces of the piezoelectric/electrostrictive unit are spaced apart from the corresponding opposite portions of the periphery of each window in the direction toward the center of the diaphragm portion, the step of firing the piezoelectric/electrostrictive layer comprising firing the piezoelectric/electrostrictive layer such that both of the opposite end parts of the diaphragm portion are upwardly curved so that each of the opposite end parts provides the stress releasing section, while a central part of the diaphragm portion between the opposite end parts is downwardly curved.

According to a second preferred arrangement of the second aspect of the invention, the step of forming at least the lower electrode and the piezoelectric/electrostrictive layer comprises forming the lower electrode and the piezoelectric/electrostrictive layer such that only one of the opposite end faces of the piezoelectric/electrostrictive unit is spaced apart from the corresponding one of the opposite portions of the periphery of each window in the direction toward the center of the diaphragm portion, the step of firing the piezoelectric/electrostrictive layer comprising firing the piezoelectric/electrostrictive layer such that only one of the opposite end parts of the diaphragm portion is upwardly curved so as to provide the stress releasing section, while a part of the diaphragm portion which includes the other of the opposite end parts and on which the piezoelectric/electrostrictive unit is formed is downwardly curved.

The above-indicated second object of the invention may be attained according to a third aspect of the invention which provides a method of producing a piezoelectric/electrostrictive film element comprising: a ceramic substrate including a base portion having at least one window, and a diaphragm portion formed as an integral part of the base portion and closing each of the at least one window; and a film-like piezoelectric/electrostrictive unit including a lower electrode, a piezoelectric/electrostrictive layer and an upper electrode, which are formed in the order of description on an outer surface of the diaphragm portion by a film-forming process, the method comprising the steps of: preparing the ceramic substrate in which the diaphragm portion is corrugated and has a plurality of upwardly convex parts in a direction away from each window and a plurality of downwardly concave parts protruding in a direction toward each window, the convex parts and the concave parts being arranged alternately; forming, by a film-forming process, at least the lower electrode and the piezoelectric/electrostrictive layer of the piezoelectric/electrostrictive unit, on the corrugated outer surface of the diaphragm portion such that at least one of opposite end faces of the unit is spaced apart from a corresponding one of opposite portions of a periphery of each window in a direction toward a center of the diaphragm portion; and firing the piezoelectric/electrostrictive layer such that a part of the diaphragm portion on which the piezoelectric/electrostrictive unit is formed is downwardly curved so as to have a downwardly concave shape protruding in the direction toward each window, while the at least one of opposite end parts of the diaphragm portion remains corrugated, each of the at least one of opposite end parts of the diaphragm portion providing a stress releasing section.

The above-indicated second object of the invention may be attained according to a fourth aspect of the invention which provides a method of producing a piezoelectric/electrostrictive film element comprising: a ceramic substrate including a base portion having at least one window, and a diaphragm portion formed as an integral part of the base portion and closing each of the at least one window; and a film-like piezoelectric/electrostrictive unit including a lower electrode, a piezoelectric/electrostrictive layer and an upper electrode, which are formed in the order of description on an outer surface of the diaphragm portion by a film-forming process, the method comprising the steps of: preparing the ceramic substrate in which each of opposite end parts of the diaphragm portion which are adjacent to opposite portions of a periphery of each window is downwardly curved so as to have a downwardly concave shape protruding in a direction toward each window, while a center part of the diaphragm portion between the opposite end parts is upwardly curved so as to have an upwardly convex shape protruding in a direction away from each window; forming, by a film-forming process, at least the lower electrode and the piezoelectric/electrostrictive layer of the piezoelectric/ electrostrictive unit, on an outer surface of the upwardly curved center part of the diaphragm portion; and firing at least the piezoelectric/electrostrictive layer, so that the opposite end parts of the diaphragm portion each having the downwardly concave shape provide two stress damping sections.

According to one preferred arrangement of the fourth aspect of the invention, the step of preparing the ceramic substrate comprises forming the diaphragm portion such that the diaphragm portion generally has an upwardly convex shape protruding in the direction away from each window, and pressing a jig against at least a center part of the diaphragm portion in the direction toward each window.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

There will be hereinafter described one embodiment of a piezoelectric/electrostrictive film element according to the present invention, wherein a piezoelectric/electrostrictive unit is formed by a film-forming method or process on an outer surface of a diaphragm portion which closes a window of a ceramic substrate, and wherein a suitably dimensioned stress releasing or damping section is formed on at least one section of the diaphragm portion on which the piezoelectric/ electrostrictive unit is not disposed. In this embodiment, the ceramic substrate has one window.

Figure 1:
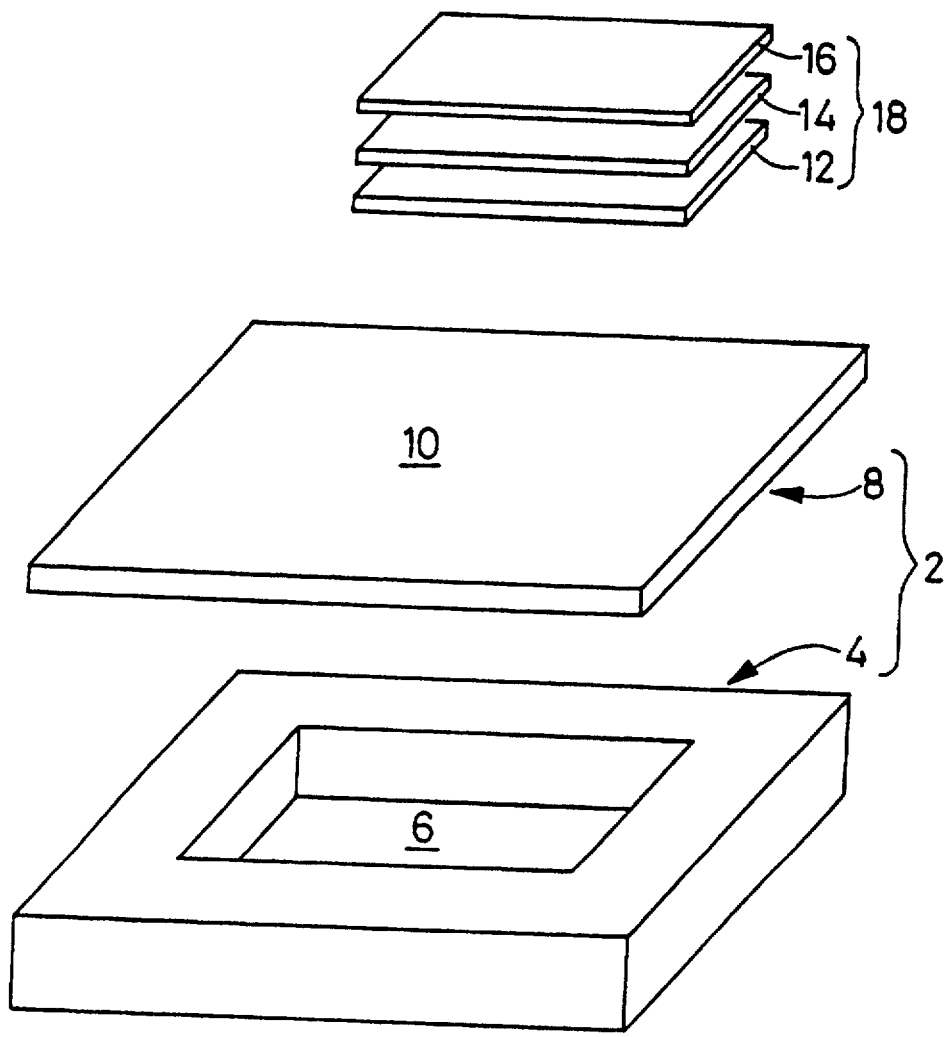
FIG. 1 is an exploded perspective view showing one example of a basic structure of a piezoelectric/ electrostrictive film element constructed according to the present invention.
Figure 2:
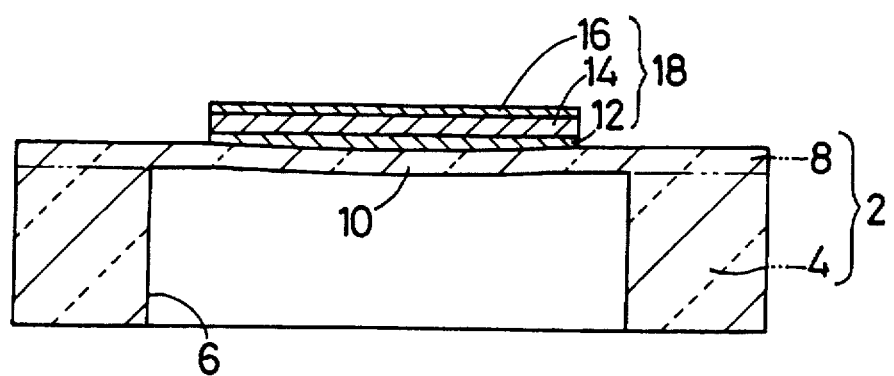
FIG. 2 is an elevational view in cross section of the piezoelectric/electrostrictive film element of FIG. 1.

Referring to FIGS. 1 and 2 showing one example of a piezoelectric/electrostrictive film element (hereinafter referred to as "P/E film element") according to the present invention, a ceramic substrate 2 has an integral structure which consists of a base plate 4 having a predetermined thickness, the base plate 4 having a rectangular window 6 of a suitable size, and a relatively thin diaphragm plate 8 which closes the window 6. The diaphragm plate 8 is superposed on one of the opposite major surfaces of the base plate 4 which serves as a support member. The diaphragm plate 8 has a diaphragm portion 10 which corresponds to the window 6 of the base plate 4. On the outer surface of the diaphragm portion 10 of the planar ceramic substrate 2, a lower electrode film 12, a piezoelectric/electrostrictive layer (hereinafter referred to as "P/E layer") 14 and an upper electrode film 16 are laminated in this order by a known film-forming method, so as to form a film-like piezoelectric/ electrostrictive unit (hereinafter referred to as "P/E unit) ". As known in the art, a suitable voltage is applied to the lower and upper electrodes 12, 16, through respective lead portions (not shown).

Where the P/E film element constructed as described above is used as an actuator, a voltage is applied between the two electrodes 12, 16 of the P/E unit 18 in a known manner, so that the P/E layer 14 is exposed to an electric field, and undergoes a mechanical distortion induced by the electric field. Consequently, the P/E unit 18 causes a flexing, bending or deflecting displacement or force due to the transverse effect of distortion of the P/E layer 14, such that the displacement or force acts on the ceramic substrate 2 (diaphragm portion 10) in a direction perpendicular to the plane or major surfaces of the substrate 2.

Figure 3:
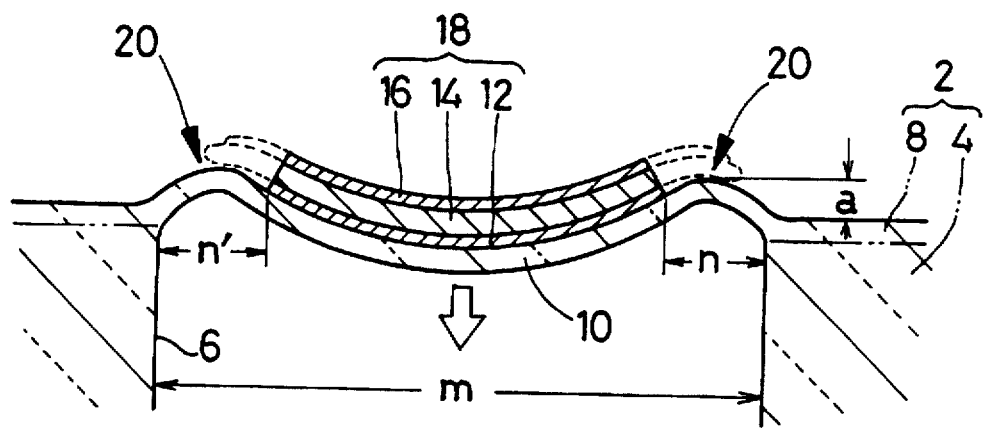
FIG. 3 is an enlarged view in cross section of the film element of FIG. 1, which is taken in a plane which is parallel to the short side of a window and which passes the center of the window.

The P/E film element according to the present invention has a suitable stress releasing section which is formed as part of the diaphragm portion 10 of the ceramic substrate 2 at which the P/E unit 18 is not formed. Described more specifically, in the present P/E film element, at least one of the opposite end faces of the P/E unit 18 (as seen in FIG. 2) formed on the diaphragm portion 10 is located inwardly of the diaphragm portion 10 so that the end face of the P/E unit 18 is inwardly offset or spaced apart from the corresponding end of the window 6 formed in the ceramic substrate 2. In other words, the stress releasing section consists of a part of the diaphragm portion which is located between the at least one of the opposite end faces of the P/E unit 18 and the corresponding end or ends of the window 6. In a P/E film element as shown in FIG. 3, for instance, two stress releasing sections 20, 20 are formed on the opposite sides (as seen in FIG. 3) of the P/E unit 18, at the sections of the diaphragm portion 10 located between the opposite end faces of the P/E unit 18 and the corresponding opposite ends of the window 6. In other words, the two stress releasing sections 20, 20 consist of the above-indicated sections of the diaphragm portion 10 which have respective width dimensions n, n' as indicated in FIG. 3 and which do not carry the P/E unit 18 thereon. As shown in FIG. 3, each of the stress releasing sections 20 has an upwardly curved convex shape which protrudes outwards in a direction away from the bottom of the window 6. In the presence of the thus formed stress releasing sections 20 of the diaphragm portion 10, stresses arising in the P/E unit 18 may be converted into displacement with high efficiency, and the diaphragm portion 10 undergoes a sufficiently large amount of displacement by application of a relatively low voltage to the P/E unit 18. In addition, the provision of the stress releasing sections 20 as described above is effective to prevent reduction in the amount of displacement of the diaphragm portion 10 when two or more adjacent P/E units (18) are simultaneously actuated. Thus, the stress releasing sections 20 make it possible to satisfy the demand for increased density of the P/E units 18 per unit area of the P/E film element.

Upon actuation of the P/E unit 18 formed on the diaphragm portion 10 having the two stress releasing sections 20, 20 which are formed on the opposite sides of the P/E unit, respectively and which have the upwardly curved convex shape as shown in FIG. 3, the diaphragm portion 10 is displaced downward as indicated by an arrow in FIG. 3, in other words, is deflected toward the window 6. In the presence of the stress releasing sections 20, 20 formed as described above, the stresses generated in the P/E unit 18 upon actuation thereof are less likely to be influenced by a force from a base portion of the ceramic substrate 2 (i.e., base plate 4), whereby the stresses generated in the P/E unit 18 are converted into displacement of the diaphragm portion 10 with high efficiency. Further, the diaphragm portion 10 undergoes a sufficiently large amount of displacement by application of a relatively low voltage. The stress releasing sections 20 are effective to avoid or reduce the influence of the force from the base portion of the ceramic substrate 2 which would act on the P/E unit 18 upon actuation thereof. Accordingly, the amount of displacement of each diaphragm portion 10 is less likely to be reduced even when the two or more adjacent P/E units 18 are actuated at the same time, and the amount of displacement of the simultaneously actuated P/E units 18 is not so different from the displacement amount when each P/E unit 18 is actuated independently of the other P/E units.

The P/E film element of FIG. 3 has the diaphragm portion 10 whose central part carrying the P/E unit 18 is downwardly curved in a concave shape, protruding into the window 6, so that the diaphragm portion 10 generally assumes an "M" shape in cross section. In particular, the present P/E film element having the "M"-shaped diaphragm portion 10 with the two stress releasing sections 20, 20 which are formed on the opposite sides of the P/E unit 18 effectively yields the advantages as described above. The term "end face" of the P/E unit 18 generally means the end faces of the three layers 12, 14, 16 of the P/E unit 18, which are flush with one another. Where the P/E layer 14 and the upper electrode 16 are longer than the lower electrode 12 as indicated by a broken line of FIG. 3, for example, the end face of the P/E unit 18 is defined as the end face of the lower electrode 12. Thus, the width dimension n, n' of each stress releasing section 20 is determined by the end face of the shortest one of the three layers of the P/E unit 18.

It is to be understood that the construction of the P/E film element according to the present invention is by no means limited to that of the film element of FIG. 3. For instance, the two stress releasing sections 20, 20 need not be symmetrically located on the opposite sides of the P/E unit 18. The principle of the present invention may be embodied in the form of P/E film elements as shown in FIG. 4 through FIG. 7, which provide substantially the same advantages as described above.

Figure 4:
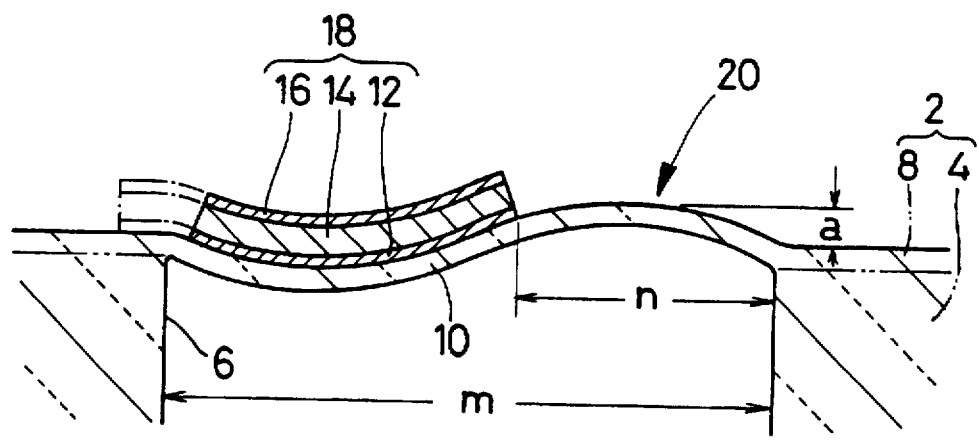
FIG. 4 is a view corresponding to that of FIG. 3, showing another example of the piezoelectric/electrostrictive film element according, to the present invention.

In the P/E film element shown in FIG. 4, the P/E unit 18 is formed on the diaphragm portion 10 such that the P/E unit 18 is offset from the central part of the diaphragm portion 10 toward one of the opposite ends of the window 6, thus providing only one stress releasing section 20 on the side of the end face of the P/E unit 18 which is remote from the above-indicated one end of the window 6. Namely, the stress releasing section 20 consists of a part of the diaphragm portion 10 which is located between the above-indicated end face of the P/E unit 18 and the corresponding end of the window 6. As shown in FIG. 4, the stress releasing section 20 has an upwardly curved convex shape which protrudes outwards, in a direction away from the window 6. On the other hand, the other part of the diaphragm portion 10 on which the P/E unit 18 is formed has a downwardly curved concave shape which protrudes inwards toward the bottom of the window 6. In the present P/E film element wherein the diaphragm portion 10 consists of the upwardly curved convex part and the downwardly curved concave part which are contiguous to each other, the convex part function as the stress releasing section 20 which improves piezoelectric/ electrostrictive characteristics when the two or more adjacent P/E units 18 are simultaneously actuated. Further, the concave part of the diaphragm portion 10 which bears the P/E unit 18 is effective to reduce the rigidity of the diaphragm portion 10 as a whole in the direction of its displacement upon application of the drive voltage to the P/E unit 18. Thus, the present P/E film element is capable of assuring a sufficiently large amount of displacement. In the film element shown in FIG. 4, the end face of the P/E unit 18 which is remote from the stress releasing section 20 is located at the corresponding end of the concave part of the diaphragm portion 10. However, the end face of the P/E unit 18 may extend beyond the corresponding end of the window 6, i.e., may extend over the base plate 4, as indicated by a one-dot chain line in FIG. 4.

Figure 5:
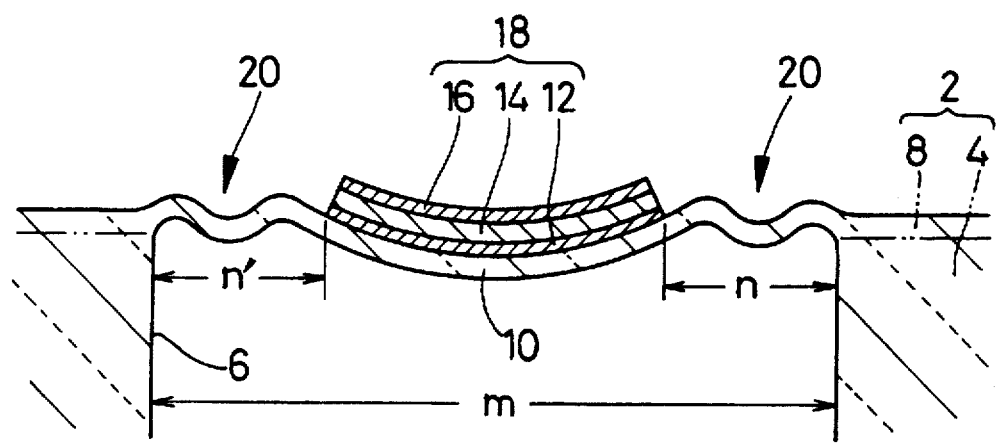
FIG. 5 is a view corresponding to that of FIG. 3, showing still another example of the piezoelectric/electrostrictive film element according to the present invention.

Referring next to FIG. 5, there will be described another form of the P/E film element of the present invention. The film element of FIG. 5 is identical with that of FIG. 3 in which the two stress releasing sections 20, 20 are formed on the opposite sides of the P/E unit 18, respectively. Unlike the stress releasing sections 20 of FIG. 3 each of which is constituted by a single upwardly curved convex part, each of the stress releasing sections 20 in the P/E film element of FIG. 5 has a corrugated shape in which the convex and concave parts are contiguous to each other. The thus formed stress releasing sections 20 are capable of assuring similar advantages as described above. Although the two stress releasing sections 20, 20 are provided on the opposite sides of the P/E unit 18 in the film element of FIG. 5, a single corrugated stress releasing section 20 may be provided on one of the opposite sides of the P/E unit 18, as in the film element of FIG. 4.

Figure 6:
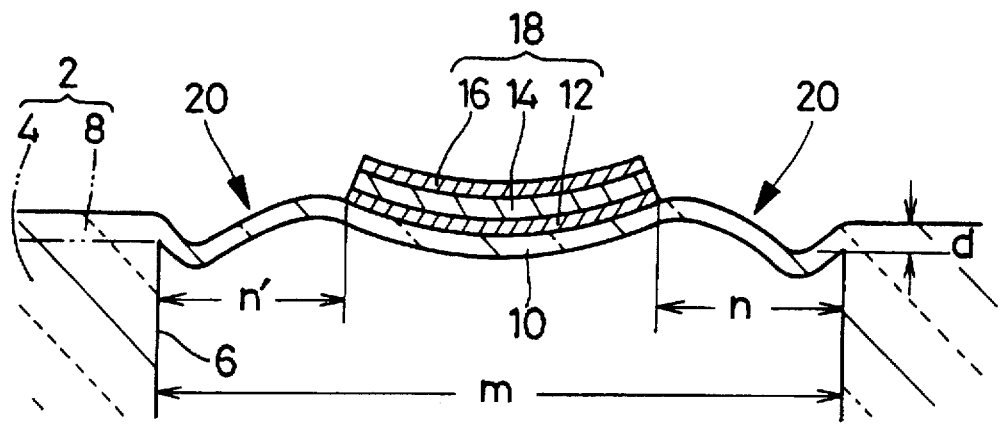
FIG. 6 is a view corresponding to that of FIG. 3, showing a further example of the piezoelectric/electrostrictive film element according to the present invention.
Figure 7:
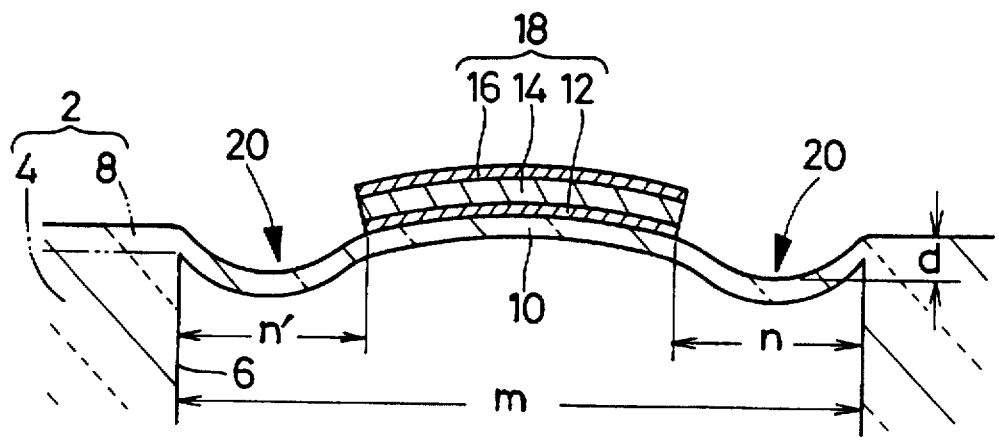
FIG. 7 is a view corresponding to that of FIG. 3, showing a still further example of the piezoelectric/electrostrictive film element according to the present invention.

Referring to FIGS. 6 and 7, there are shown other forms of the P/E film element constructed according to the present invention. In the film elements of the preceding examples of FIGS. 3–5, the end part of the stress releasing section 20 adjacent to the corresponding end of the window 6 protrudes outwards in the direction away from the window 6. In contrast, the corresponding end part of the stress releasing section 20 of FIGS. 6 and 7 protrudes inwards toward the bottom of the window 6.

In the P/E film element of FIG. 6, the central part of the diaphragm portion 10 which carries the P/E unit 18 is downwardly curved on the side of the window 6, while, in the film element of FIG. 7, the central part of the diaphragm portion 10 which carries the P/E unit 18 is upwardly curved and protrudes outwards in the direction away from the window 6. In particular, the construction of the P/E film element of FIG. 6 is effective to reduce the rigidity of the diaphragm portion 10 in the direction of displacement of the diaphragm portion 10 upon application of a voltage thereto, assuring a large amount of displacement thereof.

In the P/E film elements of FIGS. 6 and 7, the two concave stress releasing sections 20, 20 are formed on the opposite sides of the P/E unit 18, respectively. However, the film elements of FIGS. 6 and 7 may be modified such that a single stress releasing section 20 is formed on one of the opposite sides of the P/E unit 18, as in the film element of FIG. 4.

It will be understood from the above description that the end part of the stress releasing section 20 adjacent to the corresponding end of the window 6 preferably constitute a part of the convex or concave shape. Namely, it is desirable that the stress releasing section 20 does not have a flat end part which is flush with the upper surface of the ceramic substrate 2 and which extends straight from the peripheral edge of the window 6. The flat or straight end part of the stress releasing section 20 would deteriorate its stress releasing effect, in other words, reduce the amount of displacement of the P/E units 18 when they are simultaneously actuated. Since such a flat end part would not exhibit a sufficiently high stress releasing effect, the stress releasing section constituted by a combination of the flat part and curved part is disadvantageous where the density of the P/E units 18 per unit area of the film element is high. It is preferable that the width dimension (n, n') of each stress releasing section located between the end face of the P/E unit and the corresponding end of the window be as small as possible, while assuring a sufficient stress releasing effect.

As is apparent from the above description, the diaphragm portion 10 having the stress releasing section(s) 20 constructed according to the present invention preferably has at least one inflection point for attaining an enhanced stress releasing effect. Namely, the diaphragm portion 10 formed according to the present invention preferably has at least one convex portion and at least one concave portion which are contiguous to each other, so as to provide at least one inflection point in the diaphragm portion 10. It is noted that the inflection point may be either in the stress releasing section 20 or in the portion of the diaphragm portion 10 which carries the P/E unit 18 thereon.

The stress releasing section 20 provided as part of the diaphragm portion 10 according to the present invention exhibits the desired stress releasing effect as described above as long as the stress releasing section 20 is formed along the peripheral edges of the window 6 of the ceramic substrate 2. More advantageously, the stress releasing section 20 is formed as a peripheral part of the diaphragm portion 10 over a width n, n' not greater than 40% of the short side dimension (m) of the rectangular window 6, as measured along a straight line which is parallel to the short sides of the rectangle of the window 6 and which passes the center of the window 6. The dimension n, n' is preferably not greater than 30%, and more preferably, not greater than 15% of the dimension (m). It is noted that the width dimensions n and n' are not necessarily identical with each other.

In view of the displacement characteristics of the P/E film element, it is preferable that the stress releasing section 20 constructed according to the present invention have an upwardly curved convex part, or a downwardly curved concave part. The maximum height (indicated by "a" in FIGS. 3 and 4) of the convex part of the stress releasing section 20 and the maximum depth (indicated by "d" in FIGS. 6 and 7) of the concave part of the stress releasing section 20 as measured from the upper surface of the substrate 2 are favorably determined so as not to exceed twice the thickness of the diaphragm portion 10. In particular, the maximum height "a" and the maximum depth "d" are determined to be not smaller than 1 µm and not larger than the thickness of the diaphragm portion 10.

The ceramic substrate 2 which carries the P/E unit 18 thereon is made of a known ceramic material, and is favorably selected from stabilized zirconia, partially stabilized zirconia, alumina and mixtures thereof. Particularly favorably used is a material as disclosed by the present inventors in U.S. Pat. No. 5,430,344, which contains as a major component zirconia which is partially stabilized by adding a compound(s), such as yttrium oxide, and which has a crystal phase that consists essentially of a tetragonal phase or mixture of at least two kinds of cubic, tetragonal and monoclinic phases. The ceramic substrate 2 made of the above-described material exhibits high mechanical strength and high toughness even with a small thickness, and is less likely to chemically react with the piezoelectric/ electrostrictive material. The ceramic substrate 2 is preferably produced by 1) preparing a green sheet which gives the base plate 4 and which is formed with an aperture (window 6) by use of a metal mold or by ultrasonic machining or mechanical machining, 2) superposing a thin green sheet which gives the diaphragm plate 8 (diaphragm portion 10) on the green sheet for the base plate 4 and bonding the green sheets together by thermo compression, and 3) firing the green sheets into an integral structure. The ceramic substrate 2 thus obtained exhibits high reliability. To assure sufficiently high mechanical strength, the average crystal grain size of the ceramic material for the diaphragm portion 10 which carries the P/E unit 18 thereon is generally controlled to be not greater than 5 µm, preferably, not greater than 2 µm, more preferably, not greater than 1 µm. To assure a sufficiently high operating response speed of the element and large displacement of the element, the thickness of the diaphragm portion 10 is generally 50 µm or smaller, preferably, in a range of 1 µm–30 µm, more preferably in a range of 3 µm–15 µm.

Each of the green sheets for the base plate 4 and diaphragm plate 8 may consist of a plurality of thin sheets which are superposed on each other. While the window 6 of the ceramic substrate 2 or the diaphragm portion 10 has a rectangular shape in the present embodiments, the shape of the window 6 may be suitably selected from other shapes, such as a circular, polygonal and elliptical shape, and combinations of these shapes, depending upon the application or utility of the P/E film element. In the embodiments of FIGS. 3–7 wherein the window 6 has a rectangular shape as shown in FIG. 1, the above-indicated dimension (m) is the length of the short sides of the window 6. Where the window 6 has a circular or elliptical shape, for example, the diameter of the circle or the length of the minor axis of the ellipse is the shortest dimension of the circular or elliptical window 6, as measured along a straight line which passes the center of the window. Thus, (m) represents the shortest dimension of the window 6 of any shape as measured along the straight line passing the center of the window. In the present invention, the stress releasing sections 20 are preferably formed along the respective opposite portions of the periphery of the window 6 which give the shortest dimension (m), so that the stress releasing sections provide a higher degree of stress releasing effect.

The above-indicated electrodes 12, 16 and the P/E layer 14 are formed by a suitable film-forming method on the diaphragm portion 10 of the ceramic substrate 2 as described above, to thereby provide the P/E unit 18. The P/E layer 14 is suitably formed by a thick-film forming method, such as screen printing, spraying, coating or dipping. The thick-film forming method utilizes a paste or slurry which contains as a main component piezoelectric/electrostrictive ceramic particles having average particle size of about 0.01 µm to 7 µm, preferably, 0.05 µm to 5 µm, so as to form the film-like P/E layer 14 on the diaphragm portion 10 of the ceramic substrate 2. In this case, the resultant film element exhibits excellent piezoelectric/electrostrictive characteristics. Among the above-described thick-film forming methods, screen printing is particularly favorably employed since it permits fine patterning at a relatively low cost. The thickness of the P/E layer 14 is preferably 50 µm or smaller, more preferably in a range of 3 µm to 40 µm, to provide a relatively large displacement of the P/E layer 14 with a relatively low voltage.

The upper and lower electrodes 16, 12 of the P/E unit 18 are formed of an electrically conductive material which can withstand oxidizing atmospheres having a considerably high temperature. For instance, the electrodes 12, 16 may be formed of a single metal, an alloy of metals, a mixture of a metal or alloy and an electrically insulating ceramic, or an electrically conductive ceramic. However, the electrode material preferably has a major component which consists of a noble metal having a high melting point, such as platinum, palladium or rhodium, or an alloy, such as silver-palladium alloy, silver-platinum alloy, or platinum-palladium alloy. The electrodes 12, 16 may also be formed of a cermet of platinum, and the ceramic material for the substrate 2 or the piezoelectric/electrostrictive material for the P/E layer 14. More preferably, the electrodes 12, 16 are made solely of platinum, or includes as a major component an alloy containing platinum. Where the above-described cermets are used, the content of the substrate material is preferably held within a range of 5–30% by volume, while the piezoelectric/ electrostrictive material is preferably held within a range of 5–20% by volume.

The electrodes 12, 16 are formed using the above-described conductive material, by suitably selected one of known film-forming methods which include the thick-film forming methods as described above, and thin-film forming methods, such as sputtering, ion-beam method, vacuum vapor deposition, ion plating, CVD and plating. The thick-film forming methods, such as screen printing, spraying, dipping and coating, may be favorably employed for forming the lower electrode 12, while the above-described thin-film forming methods as well as the thick-film forming methods may be favorably employed for forming the upper electrode 16. The thickness of the electrodes 12, 16 thus formed is generally not greater than 20 µm, preferably, not greater than 5 µm. The total thickness of the P/E unit 18 which is the sum of the thickness of these electrodes 12, 16 and the P/E layer 14 is preferably 100 µm or smaller, more preferably, 50 µm or smaller.

The piezoelectric/electrostrictive material for forming the P/E layer 14 of the P/E unit 18 preferably contains as a major component lead zirconate titanate (PZT), lead magnesium niobate (PMN), lead nickel niobate (PNN), lead manganese niobate, lead antimony stannate, lead zinc niobate, lead titanate, lead magnesium tantalate, lead nickel tantalate, or a mixture thereof. Further, a material (such as PLZT) containing an oxide or other compound of lanthanum, barium, niobium, zinc, cerium, cadmium, chromium, cobalt, antimony, iron, yttrium, tantalum, tungsten, nickel, manganese, lithium, strontium, or bismuth may be added as needed to the above-indicated piezoelectric/electrostrictive material.

Among the piezoelectric/electrostrictive materials as indicated above, it is recommended to use a material which includes as a major component one of the following mixtures: a mixture of lead magnesium niobate, lead zirconate and lead titanate; a mixture of lead nickel niobate, lead magnesium niobate, lead zirconate and lead titanate; a mixture of lead magnesium niobate, lead nickel tantalate, lead zirconate and lead titanate; and a mixture of lead magnesium tantalate, lead magnesium niobate, lead zirconate and lead titanate. Further, these materials in which a part of lead (pb) is substituted by strontium and/or lanthanum may be favorably used for the P/E layer 14. These piezoelectric/electrostrictive materials are recommended when the P/E layer 14 is formed by a thick-film forming method, such as screen printing. When the piezoelectric/ electrostrictive material having three or more components is used, its piezoelectric/electrostrictive characteristics vary depending upon the composition of the components of the material. However, a three-component material composed of lead magnesium niobate, lead zirconate and lead titanate, or a four-component material composed of lead magnesium niobate, lead nickel tantalate, lead zirconate and lead titanate, or a four-component material composed of lead magnesium tantalate, lead magnesium niobate, lead zirconate and lead titanate preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly desirable to employ one of the following compositions, that is, 1) a composition containing 15–50 mol % of lead magnesium niobate, 10–45 mol % of lead zirconate and 30–45 mol % of lead titanate, 2) a composition containing 15–50 mol % of lead magnesium niobate, 10–40 mol % of lead nickel tantalate, 10–45 mol % of lead zirconate and 30–45 mol % of lead titanate, 3) a composition containing 15–50 mol % of lead magnesium niobate, 10–40 mol % of lead magnesium tantalate, 10–45 mol % of lead zirconate and 30–45 mol % of lead titanate.

The electrode films and P/E layer (12, 16, 14) formed on the outer surface of the diaphragm portion 10 of the ceramic substrate 2 as described above may be either heat-treated (fired) in different steps after each of these films and layer is formed, for integration with the substrate 2, i.e., the diaphragm portion 10, or concurrently heat-treated (fired) in a single step for integration with the substrate 2 after all of the films and layer are formed on the diaphragm portion 10. Further, the above heat-treatment (firing) of the electrode films (12, 16) may not be required depending upon the method of forming these films. The temperature of the heat treatment (firing) for integration of the electrode films and P/E layer with the diaphragm portion is generally controlled to be in a range of 500° C. to 1400° C., preferably 1000° C. to 1400° C. To avoid changes in the composition of the piezoelectric/electrostrictive material of the P/E layer 14 at a high temperature, it is desirable to heat-treat or fire the P/E layer 14 while controlling the firing atmosphere to include the evaporation source of the piezoelectric/electrostrictive material. It is also recommended to fire the P/E layer 14 while it is covered with a suitable covering member so that the surface of the layer 14 is not directly exposed to the firing atmosphere. The covering member may be formed of a material similar to that of the ceramic substrate 2.

The P/E film element constructed as described above may be produced by various methods known to those skilled in the art, including the following five methods. In the first method, a section of the diaphragm portion 10 on which the P/E unit 18 is not disposed is formed into a desired shape upon firing of the P/E layer 14 of the P/E unit 18, by controlling coefficients of thermal expansion of the ceramic substrate 2 and P/E unit 18. In the second method, a pressing force is applied to the diaphragm portion 10 when the P/E layer 14 of the P/E unit 18 is fired, so that the section of the diaphragm portion 10 on which the P/E unit 18 is not disposed is formed into a desired shape. In the third method, the peripheral portion of the diaphragm portion 10 is formed into a desired shape by controlling the firing shrinkage and sinterability of the P/E layer 14 of the P/E unit 18. In the fourth method, the diaphragm portion 10 in its green state is suitably shaped before firing thereof. In the fifth method, the width and thickness of the lower electrode 12 and P/E layer 14 are controlled. In the present invention, the P/E film element is advantageously produced by one of the following methods illustrated shown in FIG. 8 through FIG. 12.

Figure 8A:
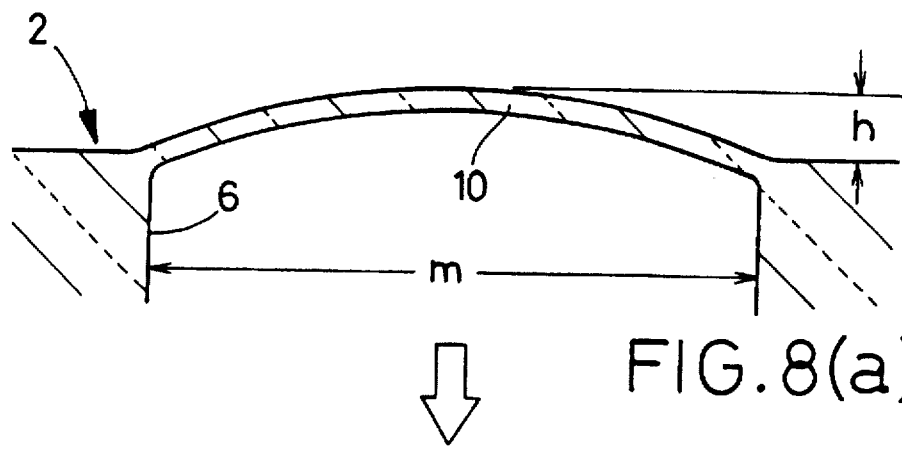
FIGS. 8(a)–8(c) are enlarged views partly in cross section, showing process steps of a method of producing the piezoelectric/electrostrictive film element of FIG. 3.
Figure 8B:
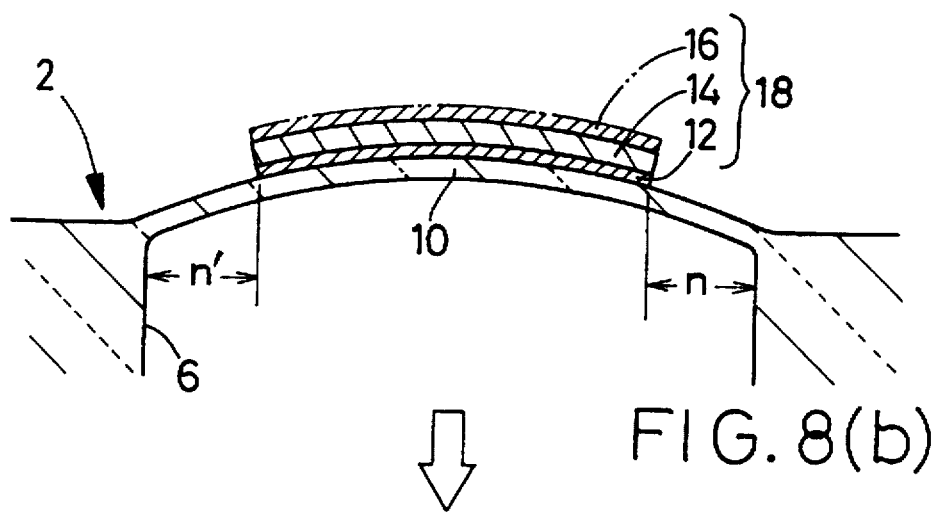
Figure 8C:
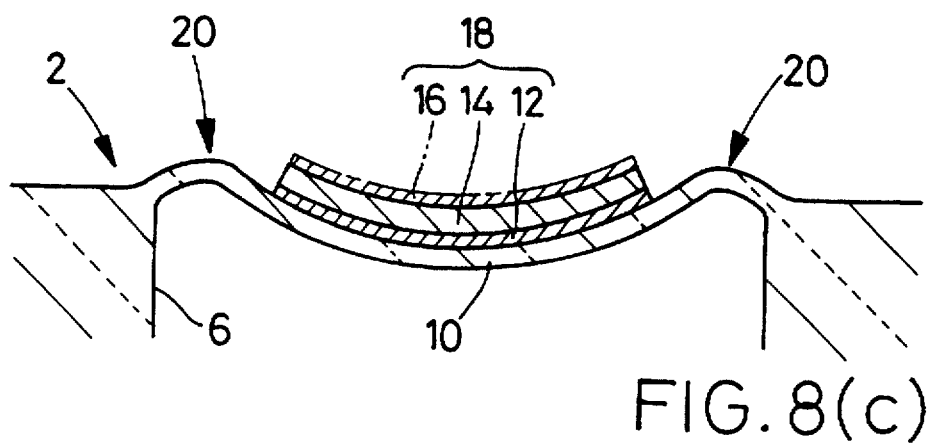

Referring to FIGS. 8(a)–8(c), there will be described one example of the method for producing the P/E film element of FIG. 3. Initially, the ceramic substrate 2 is prepared with the diaphragm portion 10 which has a convex shape, that is, protrudes outwards in the direction away from the window 6 by an amount "h" as indicated in FIG. 8(a). After the ceramic substrate 2 is fired, the lower electrode 12 and the P/E layer 14 are successively laminated on the outer surface of the convex diaphragm portion 10 by a suitable film-forming method, such that the laminar structure of the electrode 12 and P/E layer 14 is spaced apart from the opposite ends of the window 6 as seen in FIG. 8(b), by predetermined suitable distances n, n' as indicated in FIG. 8(b). When the P/E layer 14 is fired after the upper electrode 16 is formed thereon as needed, the P/E layer 14 has greater firing shrinkage than the diaphragm portion 10 which has already been fired, whereby a central part of the diaphragm portion 10 which carries the P/E unit 18 is curved or deflected inwards, toward the window 6, as shown in FIG. 8(c). Accordingly, there are formed two stress releasing sections 20, 20 each having an upwardly curved convex shape, on the opposite sides of the P/E unit 18, respectively.

The ceramic substrate 2 in the processes of FIGS. 8(a) and 8(b), which has the convex diaphragm portion 10 that protrudes outwards, is easily obtained by controlling the sintering rate or speed or the shrinkage percentage of the base plate 4 and diaphragm plate 8 (FIGS. 1 and 2), suitably adjusting the configuration of the diaphragm plate 8 in its green state before firing thereof, or utilizing the difference in the thermal expansion coefficient between the two plates 4, 8. More specifically described, the diaphragm portion 10 protrudes outwards if the sintering of a green sheet which gives the diaphragm plate 8 precedes the sintering of a green sheet which gives the base plate 4, or if the shrinkage caused by the sintering of the green sheet for the base plate 4 is greater than that of the green sheet for the diaphragm plate 8.

The amount "h" of protrusion of the diaphragm portion 10 of the ceramic substrate 2 is generally 1–20% of the shortest dimension (m) as measured along the straight line which passes the center of the window, preferably 2–10% of the dimension (m). If the protrusion amount "h" is too small, the amount of downward deflection of the diaphragm portion 10 upon firing of the P/E layer 14 may be excessively large. If the protrusion amount "h" is too large, it may be difficult for the diaphragm portion 10 to be downwardly deflected into the window 6 upon firing of the P/E layer 14.

Figure 9A:
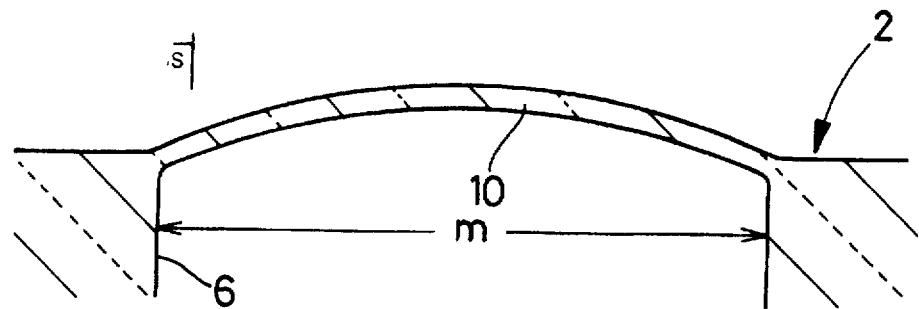
FIGS. 9(a)–9(c) are enlarged views partly in cross section, showing process steps of a method of producing the piezoelectric/electrostrictive film element of FIG. 4.
Figure 9B:
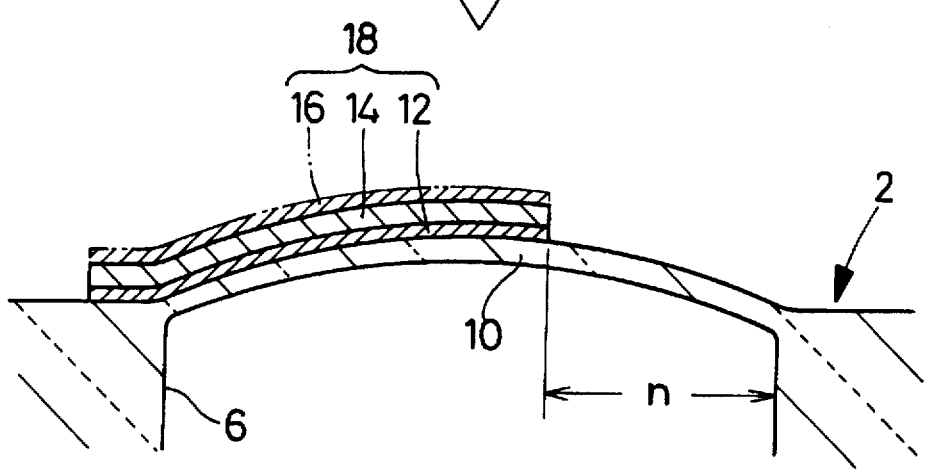
Figure 9C:
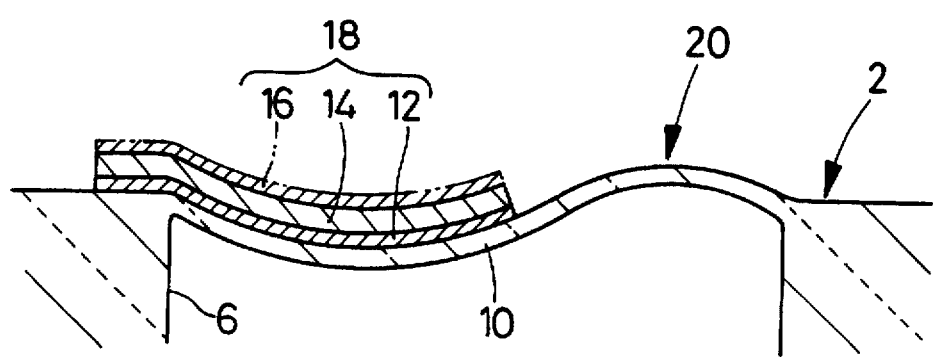

Next, there will be described a method of producing the P/E film element of FIG. 4 with reference to FIGS. 9(a)–9(c). Initially, there is prepared a ceramic substrate 2 whose diaphragm portion 10 has a convex shape similar to that of FIG. 8(a). On the outer surface of the convex diaphragm portion 10, the P/E unit 18 is formed such that the P/E unit 18 is partly disposed over one of the opposite portions of the periphery of the window 6, as shown in FIG. 9(b). Then, the P/E layer 14 is fired so as to provide a P/E film element which has a stress releasing section 20 formed along and adjacent to the other of the opposite peripheral portions of the window 6 as shown in FIG. 9(c). The part of the diaphragm portion 10 on which the P/E unit 18 is formed is downwardly deflected on the side of the window 6, assuming a concave shape, due to stresses which occur due to shrinkage of the P/E layer 14 upon its firing. On the other hand, the part of the diaphragm portion 10 which does not carry the P/E unit 18 maintains the convex shape after firing, thus providing the upwardly curved convex stress releasing section 20, as shown in FIG. 9(c).

Figure 10A:
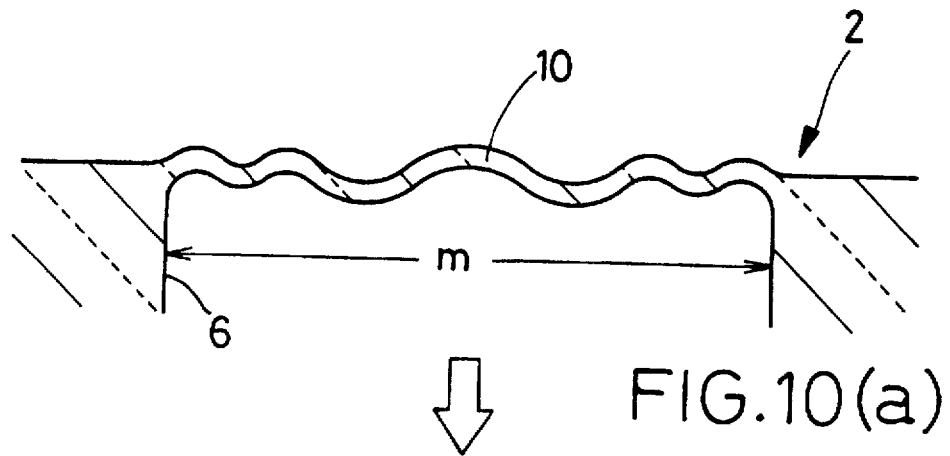
FIGS. 10(a)–10(c) are enlarged views partly in cross section, showing process steps of a method of producing the piezoelectric/electrostrictive film element of FIG. 5.
Figure 10B:
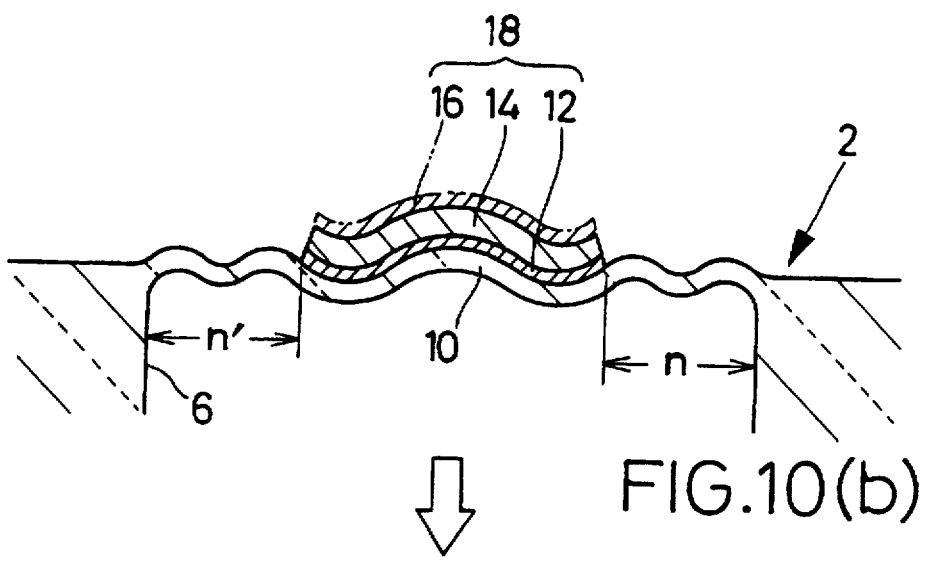
Figure 10C:
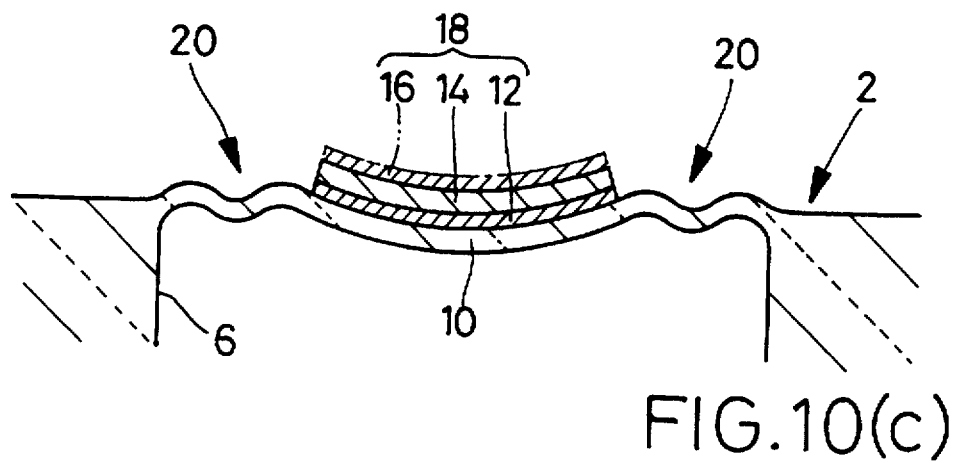

Referring next to FIGS. 10(a)–10(c), there is shown a method of producing the P/E film element of FIG. 5. Initially, there is prepared a ceramic substrate 2 whose diaphragm portion 10 has a corrugated shape as shown in FIG. 10(a). The ceramic substrate 2 having the corrugated diaphragm portion 10 can be easily obtained by the methods as described above. For instance, the diaphragm portion 10 is formed into the corrugated shape by sintering of a green sheet for the base plate 4 before sintering of a green sheet for the diaphragm plate 8. On the thus prepared ceramic substrate 2, the P/E unit 18 is formed as shown in FIG. 10(b). Then, the P/E layer 14 of the P/E unit 18 is fired so as to provide the P/E film element as shown in FIG. 10(c), wherein a central part of the diaphragm portion 10 which bears the P/E unit 18 is downwardly deflected on the side of the window 6, to form a concave shape, while the end parts of the diaphragm portion 10 which are located on the opposite sides of the P/E unit 18 as seen in FIG. 10(c) maintain the corrugated shape after the firing, thus providing two stress releasing sections 20, 20 as shown in FIG. 10(c). The thus obtained P/E film element assures improved displacement amount of the diaphragm portion 10 upon actuation of the P/E unit 18. Further, the present film element does not suffer from the adverse influence which would occur when the adjacent two or more P/E units are concurrently actuated, to thereby prevent considerable reduction in the amounts of displacement of the P/E units.

Figure 11A:
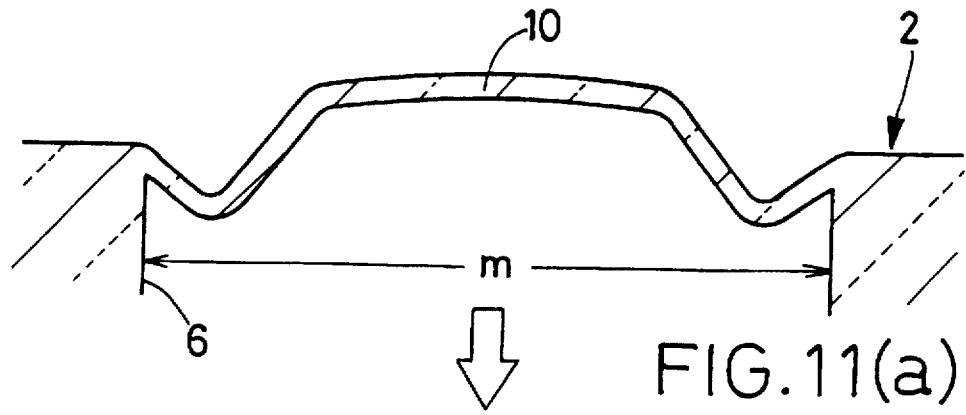
FIGS. 11(a)–11(c) are enlarged views partly in cross section, showing process steps of a method of producing the piezoelectric/electrostrictive film elements of FIGS. 6 and 7.
Figure 11B:
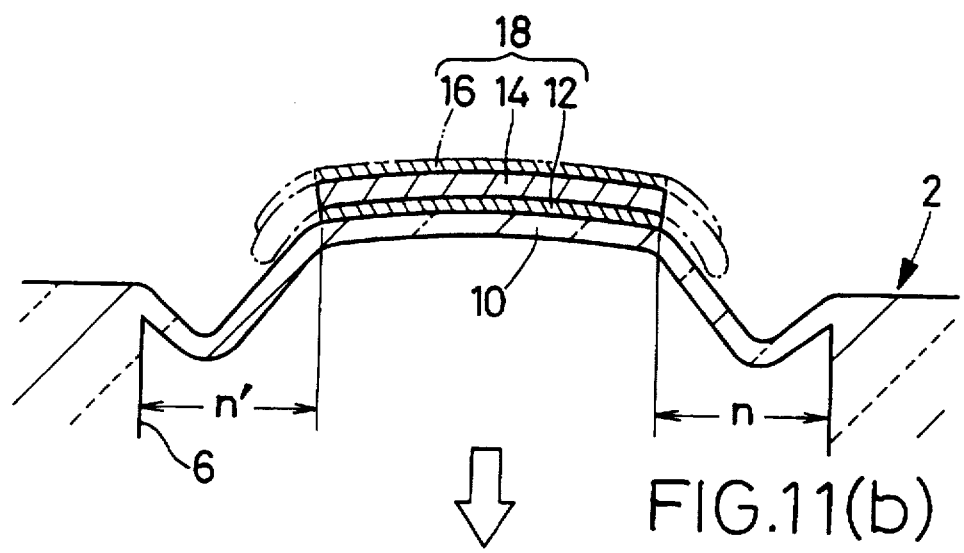
Figure 11C:
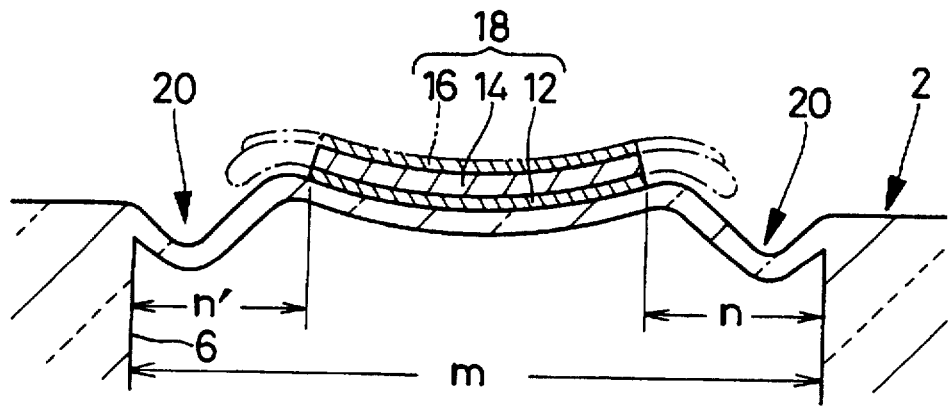

Referring to FIGS. 11(a)–11(c), there will be described one example of a method of producing the P/E film element of FIGS. 6 and 7. Initially, there is prepared a ceramic substrate 2 as shown in FIG. 11(a), wherein the diaphragm portion 10 has two recessed portions formed adjacent to the opposite peripheral portions of the window 6 which give the shortest dimension (m) of the window 6. The two recessed portions of the diaphragm portion 10, which have a suitable depth will provide two stress releasing sections. The ceramic substrate 2 having the two recessed portions is obtained according to a method as illustrated in FIGS. 12, for instance.

Figure 12A:
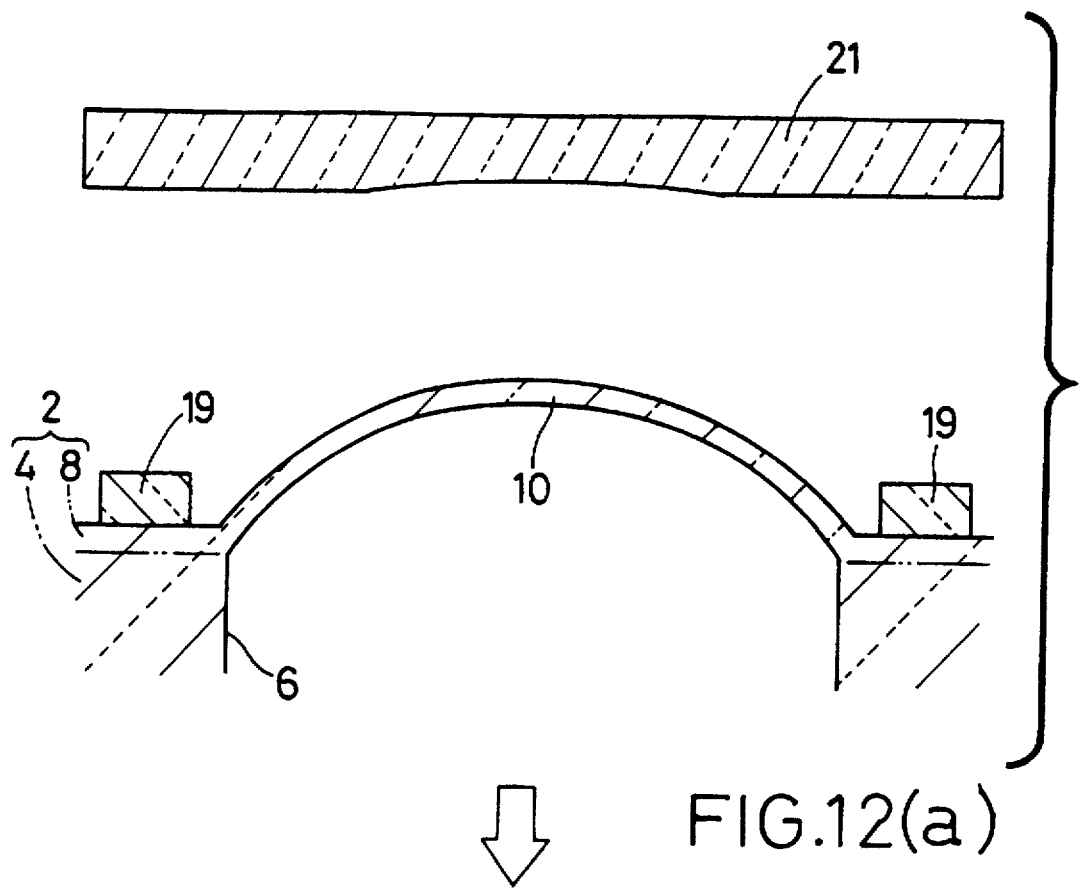
FIGS. 12(a) and 12(b) are enlarged views partly in cross section, showing process steps for producing a ceramic substrate used in the method of FIG. 11.
Figure 12B:
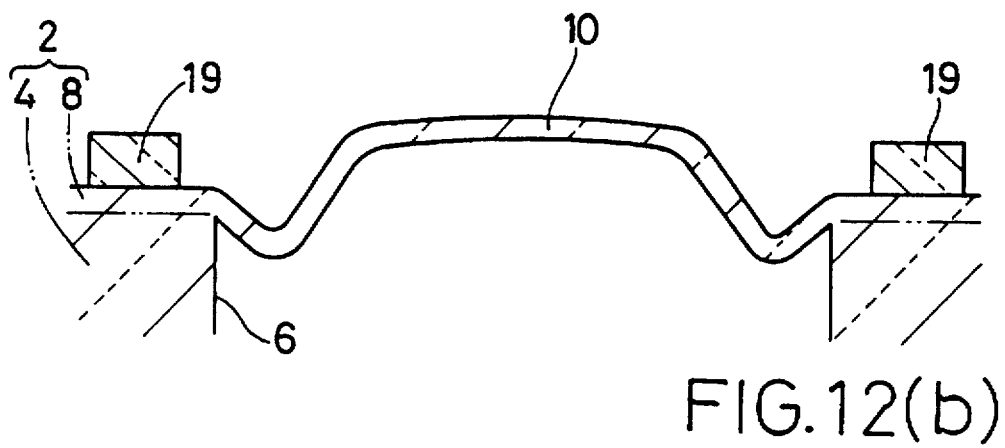

Described more specifically, referring to FIGS. 12(a) and 12(b), there is initially prepared a ceramic substrate 2 having a convex diaphragm portion 10 which protrudes outwards in the direction away from the window 6, as in the method of FIGS. 8. As shown in FIG. 12(a), a pair of spacers 19, 19 formed of a ceramic material and having a predetermined height are disposed along the opposite peripheral edges of the window 6, respectively, such that the window 6 is located between the two spacers 19. Then, a suitable pressing jig or pressure member 21 is pressed against the curved convex surface of the diaphragm portion 10 while the diaphragm portion 10 is heated and held at a suitable temperature, so that the end parts of the convex surface of the diaphragm portion 10 are downwardly deformed or deflected into the window, whereby the sections of the diaphragm portion 10 adjacent to the opposite peripheral edges of the window 6 are downwardly curved into the window 6 as shown in FIG. 12(b). The pressing jig 21 is pressed against the convex surface of the diaphragm portion 10 until the jig 21 is brought into abutting contact with the spacers 19. Thus, the diaphragm portion 10 is given the two recessed portions adjacent to the edges of the window 6, as described above. On the other hand, the upwardly projecting central part of the diaphragm portion 10 is shaped following the profile of the abutting surface of the jig. 21. In this specific example, the central part of the diaphragm portion 10 is substantially flattened. As a result, the amount of protrusion of the upwardly projecting central part is made smaller than that of the original shape of FIG. 11(a). The spacers 19 may be formed integrally with the diaphragm plate 8 and left on the ceramic substrate 2, or may be removed therefrom as needed after the pressing process of the diaphragm portion 10.

On a central part of the thus prepared ceramic substrate 2 whose diaphragm portion 10 has the two recessed portions formed as described above, the lower electrode 12 and P/E layer 14 are successively laminated by a suitable film-forming method, such that the laminar structure of the lower electrode 12 and P/E layer 14 is spaced apart from the opposite ends of the window 6, by suitable distances n, n', respectively, as shown in. FIG. 11(b). When the P/E layer 14 is fired after the upper electrode 16 is formed as needed, the P/E layer 14 has greater firing shrinkage than the diaphragm portion 10 which has been fired, whereby the central part of the diaphragm portion 10 is downwardly deformed toward the window 6, as shown in FIG. 11(c). According to this method, two stress releasing sections 20, 20 each having a concave shape are formed on the opposite sides of the P/E unit 18, respectively. Although, in the present method, the central part of the diaphragm portion 10 which carries the P/E unit 18 is downwardly curved as shown in FIG. 11(c) as in the P/E film element of FIG. 6, the central part of the diaphragm portion 10 may be upwardly curved as in the film element of FIG. 7. In this case, the diaphragm portion 10 is formed into the convex shape by controlling the degree of deformation of the central part of the diaphragm portion 10, for example, by reducing the firing shrinkage of the P/E layer 14 (to a value lower than that used in the embodiment of FIG. 11).

In the piezoelectric/electrostrictive film element constructed according to the present method, stresses caused by firing shrinkage of the P/E layer 14 which is in contact with the diaphragm portion 10 of the ceramic substrate 2 during the heat treatment of the P/E layer 14 can be reduced owing to the presence of the stress releasing section or sections 20, whereby the P/E layer 14 is sufficiently densified, and the residual stresses may be reduced.

In the above-described method, the lower electrode film 12, P/E layer 14 and upper electrode film 16 are formed on the outer surface of the diaphragm portion 10 of the ceramic substrate 2, by the above-indicated film-forming method(s), and then fired at the above-indicated firing temperature, to thereby provide respective films and layer having desired thickness values. Thus, the P/E unit 18 is formed integrally on the appropriate portion of the diaphragm portion 10. While the P/E layer 14 is desirably fired just after it is formed on the lower electrode 12, that is, before the upper electrode 16 is formed, the firing of the P/E layer 14 may be effected after the upper electrode 16 is formed on the P/E layer 14.

In the P/E film element thus obtained according to the present invention, the diaphragm portion 10 has the stress releasing section 20 formed on at least one of the opposite sides of the P/E unit 18, making it possible to convert stresses generated in the P/E unit 18 into displacement of the diaphragm portion 10 with high efficiency. Further, when a plurality of P/E units 18 are provided on respective diaphragm portions 10 of the ceramic substrate 2, the amount of displacement of each diaphragm portion 10 which occurs when the two or more adjacent P/E units 18 are simultaneously actuated is almost equal to the amount of displacement which occurs when only one P/E unit 18 is actuated. Accordingly, the P/E film element may be advantageously used as sensors, actuators, or transducers, for example.

The present P/E film element, which effectively undergoes displacement upon actuation of the P/E unit 18, formed on the outer surface of the diaphragm portion 10, is advantageously used as filters, various sensors, such as an acceleration sensor, a shock sensor, an ultrasonic sensor or an angular velocity sensor, transformers, microphones, sounding bodies, such as a loudspeaker, discriminators and various vibrators and resonators for power devices and communication devices. Further, the present film element may be particularly advantageously used as a uni-morph, bi-morph or other type of piezoelectric/electrostrictive actuators which produce displacement in the form of bending or deflection, and are used for display devices, servo-displacement elements, pulse-driven motors, ultrasonic motors, piezoelectric fans and others, which elements and motors are described in "FUNDAMENTALS TO APPLICATIONS OF PIEZOELECTRIC/ELECTROSTRICTIVE ACTUATORS", Kenji Uchino, Japan Industrial Technology Center, published by Morikita-shuppan.

Figure 13:
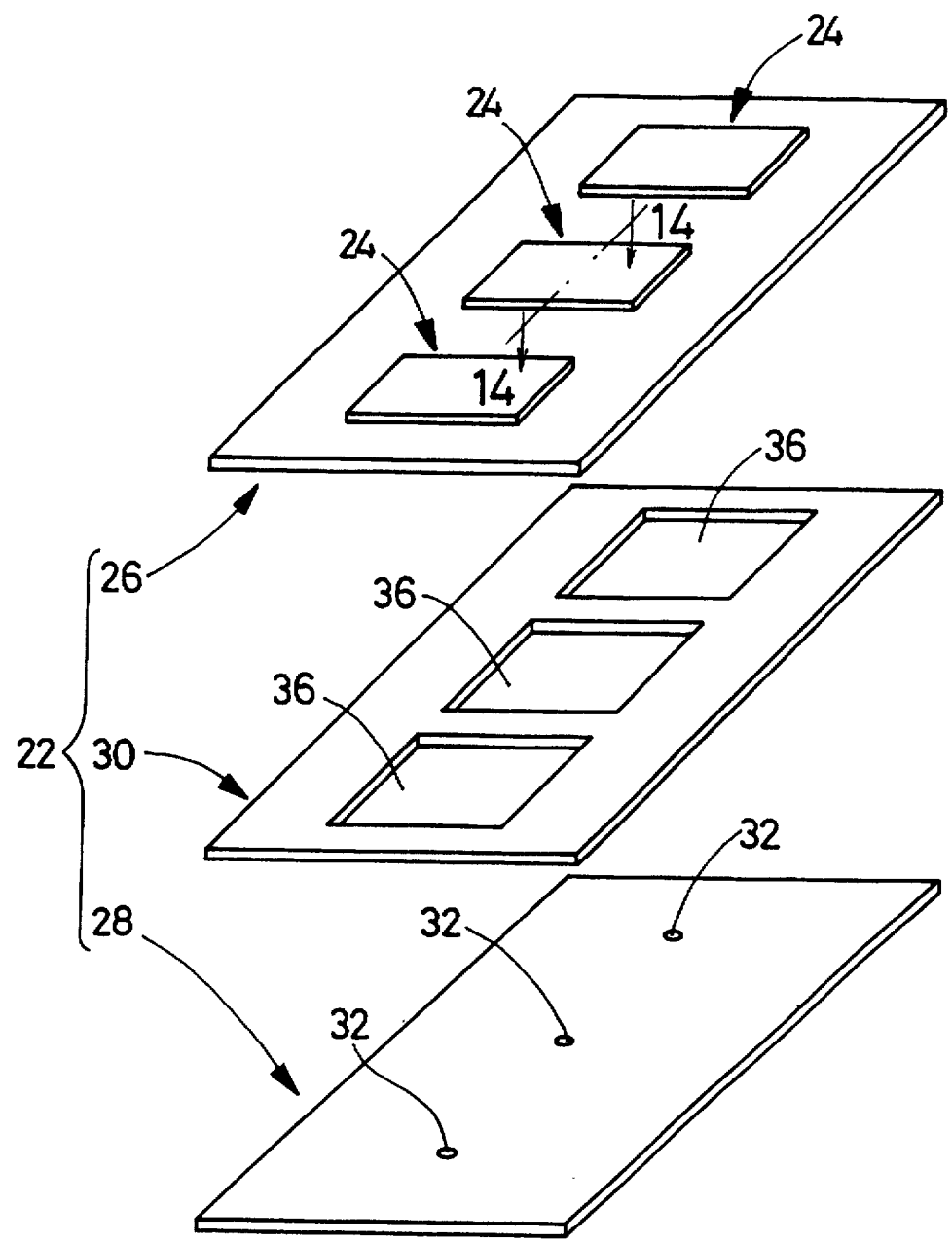
FIG. 13 is an exploded perspective view showing another example of the piezoelectric/electrostrictive film element of the invention having a plurality of piezoelectric/ electrostrictive units.
Figure 14:
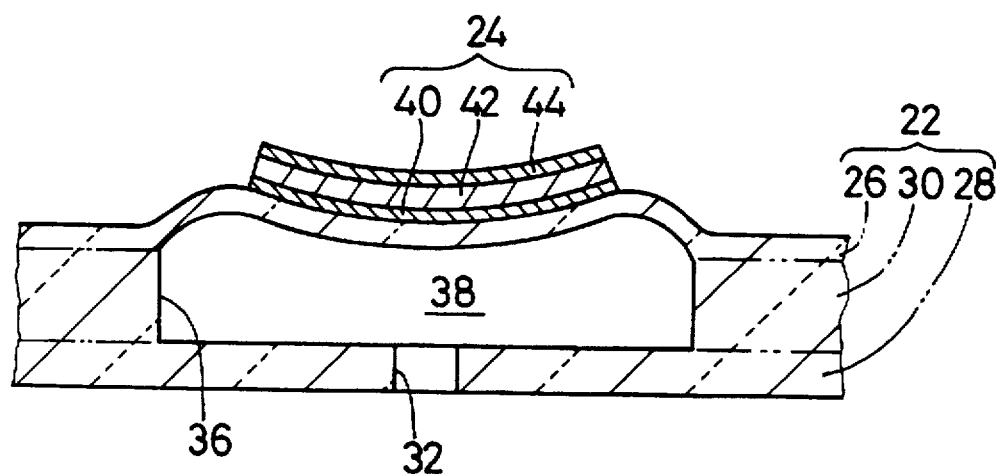
FIG. 14 is a cross sectional view taken along line 14—14 of FIG. 13.

Referring next to FIG. 13 schematically showing an example of a P/E film element according to the present invention, and to FIG. 14 schematically showing the film element in cross section taken along line 14—14 of FIG. 13. The present P/E film element has an integral structure which includes a ceramic substrate 22 and a plurality of piezoelectric/electrostrictive units (hereinafter referred to as "P/E units") 24 formed on relevant outer surfaces of thin-walled diaphragm or vibratile portions of the ceramic substrate 22. In operation, each of the diaphragm portions of the ceramic substrate 22 is flexed, bent, deflected or otherwise deformed upon application of a voltage to the corresponding P/E unit 24.

More specifically, the ceramic substrate 22 has an integral laminar structure which consists of a relatively thin closure plate (diaphragm plate) 26, a connecting plate (base plate) 28, and a spacer plate (base plate) 30 interposed between the closure and connecting plates 26, 28. These plates 26, 28, 30 are formed of a zirconia material. The connecting plate 28 has three communication holes 32, which are formed through the thickness of the plate 28 with a suitable spacing therebetween. The number, shape, dimensions, position and other parameters of the communication holes 32 may be suitably determined, depending upon a specific application of the film element. The spacer plate 30 is formed with a plurality of square windows 36 (three in this embodiment). This spacer plate 30 is superposed on the connecting plate 28 such that the communication holes 32 of the connecting plate 28 communicate with the respective windows 36. The closure plate 26 is superposed on one major surface of the spacer plate 30 remote from the connecting plate 28, so as to close the openings of the windows 36 of the spacer plate 30. With the closure plate 26, spacer plate 30 and connecting plate 28 thus superposed on each other, three pressure chambers 38 are formed within the ceramic substrate 22, such that the chambers 38 communicate with an exterior space through the communication holes 32.

Figure 15:
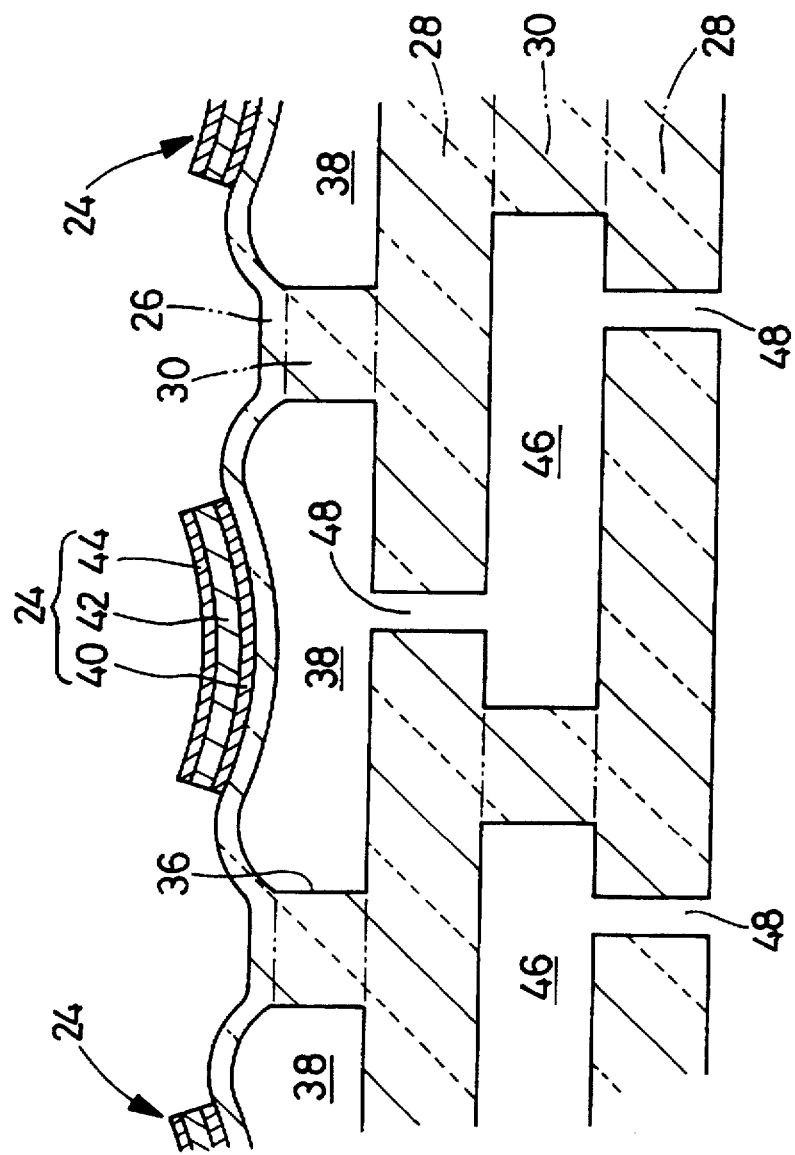
FIG. 15 is a cross sectional view corresponding to that of FIG. 14, showing still another example of the piezoelectric/ electrostrictive film element of the invention having a plurality of piezoelectric/electrostrictive units.

The ceramic substrate 22 is an integral fired body formed of a suitable ceramic material, such as a zirconia material, as described above. While the ceramic substrate 22 of the present embodiment is a three-layer structure consisting of the closure plate 26 (diaphragm plate), spacer plate 30 (base plate) and connecting plate 28 (base plate), the substrate may be formed as a four-layer or other multi-layer integral structure having four or more layers or plates, as shown in FIG. 15. Described more specifically, the film element of FIG. 15 has a five-layer structure, wherein two spacer plates 30 and two connecting plates 28 are alternately superposed on each other, on the major surface of the closure plate 26 remote from the P/E units 24. In the thus formed five-layer integral structure of the film element, the pressure chambers 38 and intermediate chambers 46 formed within the ceramic substrate communicate with each other through communication holes 48 formed through the thickness of the connecting plates 28.

Film-like P/E units 24 are formed on the outer surface of the closure plate 26, such that the P/E units 24 are aligned with the respective pressure chambers 38 as viewed in a plane parallel to the closure plate 26. Each of the P/E units 24 includes a lower electrode 40, a piezoelectric/electrostrictive layer (hereinafter referred to as "P/E layer") 42 and an upper electrode 44 which are successively formed by a suitable film-forming method(s) on a portion of the closure plate 26 which is located in alignment with one of the windows 36 of the ceramic substrate 22, that is, on the outer surface of one diaphragm portion of the ceramic substrate. In operation, the pressure in the pressure chamber 38 is increased upon actuation of the corresponding P/E unit 24, so that a fluid contained in the pressure chamber 38 can be effectively discharged through the corresponding communication hole 48. The P/E film element thus constructed may be used not only as an actuator but also as a sensor or the like, which is adapted to generate a voltage signal that represents flexural displacement of the diaphragm portion of the ceramic substrate.

In the above-constructed P/E film element, the stress releasing sections are formed on the opposite sides of each of the P/E unit 24, as viewed in the direction in which the windows 36 are arranged in a straight row.

While the P/E film element according to the present invention may be used as actuators, sensors, and transducers, particularly advantageously as a member of display devices, loudspeakers, servo-displacement elements, pulse-driven motors, ultrasonic motors, acceleration sensors, shock sensors, oscillators, vibrators and resonators, it is to be understood that the present film element has other applications known in the art.

EXAMPLES

To further clarify the present invention, some examples of the P/E film elements of the present invention will be described. However, it is to be understood that the present invention is by no means limited to the details of the following examples, but may be embodied with various changes, modifications and improvements which may occur to those skilled in the art, without departing from the principle and scope of the present invention defined in the attached claims.

EXAMPLE 1

Initially, there was prepared a rectangular ceramic substrate having four rectangular windows each of which had a width of 0.5 mm and a length of 0.7 mm. The four rectangular windows are arranged in a straight row in the longitudinal direction of the ceramic substrate such that the 0.7 mm-long long sides of the adjacent windows are spaced 0.2 mm apart from each other. The windows were closed by respective 10 μm-thick diaphragm portions of the substrate. The diaphragm portions and base portion of the ceramic substrate were formed of a powder of zirconia partially stabilized by yttria, which has an average particle size of 0.4 μm. The partially stabilized zirconia was formed into green sheets, which were then fired by a known method. The base portion of the substrate has a thickness of 200 μm when measured after firing of the substrate.

On an outer surface of each of the diaphragm portions of the ceramic substrate, a layer of a platinum paste was formed by screen printing, dried at 120° C. for ten minutes, and fired at 1350° C. for two hours, to provide an lower electrode having a thickness of 5 μm. Then, a piezoelectric/electrostrictive layer (hereinafter referred to as "P/E layer") was formed on the lower electrode by using a piezoelectric or electrostrictive material consisting essentially of lead magnesium niobate, lead zirconate and lead titanate. This material was applied by the screen printing, dried at 120° C. for twenty minutes, and fired at 1300° C., to provide the P/E layer having a thickness of 30 μm. The P/E layer was formed on the lower electrode such that each of the opposite end faces of the P/E layer was spaced apart from the corresponding one of the opposite ends of the window (0.7 mm length side of the window 6), by a a distance of 0.1 mm. A suitable mold formed of alumina ceramic was applied to the ceramic substrate with the lower electrode and P/E layer thus formed on the respective diaphragm portions, such that each of the diaphragm portions was sandwiched on its opposite sides by the alumina ceramic mold. In this state, the ceramic substrate was re-fired at 1300° C. Thus, the ceramic substrate having the "M"-shaped diaphragm portions as shown in FIG. 3 was obtained, wherein two stress releasing sections having an upwardly curved convex shape protruding away from the window 6 were formed on the opposite sides of each P/E layer, respectively, namely, at the 0.1 mm-wide opposite end parts of the diaphragm portion 10, each of which is located between one of the opposite ends or edges of the window 6 and the corresponding one of the opposite end faces of the P/E layer.

Thereafter, a Cr thin film and Cu thin film were formed by sputtering on the P/E layer provided on each of the "M" shaped diaphragm portions of the ceramic substrate, so as to provide an upper electrode having a total thickness of 0.3 μm. In this manner, the intended P/E film element according to the present invention was obtained. The thus obtained film element was subjected to polarization by applying 100V between the upper and lower electrodes of the P/E unit, so that the P/E layers are to be displaced in a direction toward the corresponding diaphragm portions upon application of a voltage to the P/E unit during use of the film element.

As a comparative example, a conventional P/E film element was produced by using the ceramic substrate prepared as described above, and bonding a 30 μm-thick plate made of a piezoelectric or electrostrictive material to each diaphragm portion of the substrate, with a conductive adhesive.

To evaluate piezoelectric/electrostrictive characteristics of the present and conventional film elements obtained as described above, a voltage of 30V was applied between the upper and lower electrodes of each of the P/E units of each film element, in the direction of the polarization treatment explained above, and the amount of displacement of the relevant P/E unit was measured by a laser Doppler device. In this manner, all of the four P/E units were actuated at different times, and a first average of the displacement amounts of these P/E units was calculated. Similarly, a voltage of 30V was applied to all of the four P/E units of each element for simultaneous actuation thereof, and the amounts of displacement of the respective P/E units were measured. A second average of the amounts of displacement of the four P/E units that were actuated at the same time was also calculated. Based on the thus obtained results, there was calculated the ratio of the displacement amount measured upon actuation of all the P/E units (simultaneous actuation) to the displacement amount measured upon actuation of each single P/E unit (single actuation), as represented by (the second average/the first average)×100 (%) The results of the measurement and calculation are indicated in the TABLE 1 below.

TABLE 1

|  | Simultaneous actuation/ single actuation | Single actuation |
|---|---|---|
| present film element | 100% | 0.23 μm |
| conventional film element | 50% | 0.11 μm |

It will be apparent from the above results of TABLE 1 that the P/E film element according to the present invention, in which each of the diaphragm portions of the ceramic substrate has the stress releasing sections which have an upwardly curved convex shape and which are formed at the opposite end parts of the diaphragm portion on which the P/E unit is not formed, exhibited substantially the same amount of displacement in the case where all the P/E units were simultaneously actuated, and in the case where each one P/E unit was actuated alone. This is a great improvement over the conventional film element, in which the ratio of the displacement amount upon actuation of all the P/E units to the displacement amount upon actuation of each single P/E unit was 50%.

EXAMPLE 2

Initially, a ceramic powder, which has an average particle size of 0.4 μm and consists essentially of 85% by weight of a zirconia powder partially stabilized by 3 mol % of yttria, and 15% by weight of alumina, was mixed by a known method with a binder, a plasticizer and an organic solvent, so as to prepare a slurry. This slurry was used to form, by doctor blade method, a green sheet which provides after firing the base plate of the ceramic substrate having a thickness of 200 μm.

On the other hand, a zirconia powder partially stabilized by 3 mol % of yttria and having the average particle size of 0.3 μm was mixed by a known method with a binder, a plasticizer and an organic solvent, so as to prepare a slurry. This slurry was used to form, by a reverse roll coater machine, a green sheet which provides after firing the diaphragm plate having a thickness of 10 μm.

Thereafter, the green sheet for the base plate was punched in a pattern by means of a suitable metal mold, so as to form the windows. Then, the green sheet for the diaphragm plate was superposed on the green sheet for the base plate, and bonded together by thermo-compression under pressure of 100 kg/cm$^2$, at 80° C. for one minute. The thus obtained integral laminar structure was fired at 1500° C. for two hours, to thereby provide the ceramic substrate with the convex diaphragm portions protruding outwards by a distance (h) of 20 μm.

Subsequently, the lower electrode and P/E layer were formed on the outer surface of each of the convex diaphragm portions of the thus obtained ceramic substrate, in the same manner as in EXAMPLE 1. After firing of the lower electrode and P/E layer in the same manner as in EXAMPLE 1, the ceramic substrate with the "M"-shaped diaphragm portions as shown in FIG. 3 was obtained. Described more specifically, in the obtained ceramic substrate, the central part of the diaphragm portion on which the lower electrode and P/E layer were formed was downwardly curved to provide a concave shape. On the other hand, the opposite end parts of the diaphragm portion which do not carry the lower electrode and P/E layer maintained the original convex shape protruding outwards away from the window, to thereby provide two stress releasing sections each having an upwardly curved convex shape, on the opposite sides of the P/E layer, respectively. Then, the upper electrode was formed on the fired P/E layer of each P/E unit in the same manner as in EXAMPLE 1, so as to provide the P/E film element constructed according to the present invention.

The thus obtained ceramic substrate was subjected to polarization treatment. Then the first average of displacement amounts of all of the P/E units measured when they were actuated at different times, and the second average of displacement amounts of all of the P/E units measured when they were actuated simultaneously were obtained in the same manner as in EXAMPLE 1. Based on the thus obtained results, the ratio as represented by (the second average/the first average)×100 (%) was calculated. The results showed that the present film element exhibited excellent characteristics similar to those of the film element of EXAMPLE 1.

EXAMPLE 3

Initially, a powder, which has an average particle size of 0.4 μm and consists essentially of 99.75% by weight of a zirconia powder partially stabilized by 3 mol % of yttria, and 0.25% by weight of alumina, was heat-treated at 500° C. for two hours, and then was mixed in a ball mill for thirty hours by an ordinary method with a binder, a plasticizer and an organic solvent, so as to prepare a slurry. The obtained slurry was used to form, by doctor blade method, a green sheet which provides after firing the base plate of the ceramic substrate having a thickness of 200 μm.

In the meantime, a powder, which has an average particle size of 0.2 μm and consists essentially of 70% by weight of a zirconia powder partially stabilized by 3 mol % of yttria, and 30% by weight of alumina, was mixed in a ball mill for thirty hours by an ordinary method with a binder, a plasticizer and an organic solvent, so as to prepare a slurry. The slurry was used to form, by a reverse roll coater machine, a green sheet which provides after firing the diaphragm plate having a thickness of 10 μm.

Thereafter, the green sheet for the base plate was punched in a pattern by means of a suitable metal mold, so as to form the windows. Then, the green sheet for the diaphragm plate was superposed on the green sheet for the base plate, and was bonded together by thermo-compression under pressure of 100 kg/cm² at 80° C. for one minute. The thus obtained integral laminar structure was fired at 1500° C. for two hours, to provide the ceramic substrate with diaphragm portions having a corrugated shape as shown in FIG. 10(a).

Subsequently, the lower electrode and P/E layer were formed on the outer surface of each of the corrugated diaphragm portions of the thus obtained ceramic substrate, in the same manner as in EXAMPLE 1. After firing of the lower electrode and P/E layer, there was obtained a ceramic substrate with diaphragm portions each having corrugated stress releasing sections formed on the opposite sides of the P/E layer, respectively. Namely, the corrugated shape of the diaphragm portion was maintained at the opposite end parts of the diaphragm portion on which the lower electrode and P/E layer are not disposed, so as to provide the corrugated stress releasing sections. Then, the upper electrode was formed on the fired P/E layer in the same manner as in EXAMPLE 1, whereby a P/E film element constructed according to the present invention was produced.

The thus obtained film element was subjected to polarization treatment and then, the ratio of the displacement amount upon actuation of all the P/E units (simultaneous actuation) to the displacement amount upon actuation of a single P/E unit (single actuation) was obtained in the same manner as in EXAMPLE 1. The results showed that the above-indicated ratio was 85% in the present film element having the corrugated stress releasing sections formed on the opposite sides of each of the P/E units. Thus, it was recognized that the corrugated stress releasing sections formed as described above were effective to prevent conventionally experienced considerable reduction in the amount of displacement when the two or more adjacent P/E units were actuated at the same time. The results also showed that the average value of the amounts of displacement of all P/E units measured when they were actuated at different times (single actuation) was 0.18 μm.

EXAMPLE 4

In the same manner as in EXAMPLE 3, a green sheet for the base plate was formed by using a powder having an average particle size of 0.4 μm and consisting essentially of 99.9% by weight of a zirconia powder partially stabilized by 4 mol % of yttria, and 0.1 % by weight of alumina. Similarly, a green sheet for the diaphragm plate was formed by using a powder having an average particle size of 0.4 μm and consisting essentially of 99.5% by weight of a zirconia powder partially stabilized by 4 mol % of yttria, and 0.5 % by weight of alumina.

The thus obtained green sheet for the base plate was punched in a pattern by using a suitable metal mold, so as to form the windows. The green sheet for the diaphragm plate was superposed on the green sheet for the base plate, and thermo-compressed under pressure of 100 kg/cm² at 80° C. for one minute. The thus obtained integral laminar structure was fired at 1500° C. for two hours, to thereby provide a ceramic substrate with convex diaphragm portions each of which protrudes outwards by a distance of 50 μm.

On the above obtained ceramic substrate, a pair of alumina spacers having a height of 20 μm were disposed along the long sides of each of the windows such that the spacers sandwich the opening of each window, as shown in FIG. 12(a). Then, a planar porous pressing jig made of alumina was disposed on each of the convex diaphragm portions. In this state, the ceramic substrate was fired at 1500° C. for five hours, so as to provide a ceramic substrate with each diaphragm portion having a convex central part having a height of 20 μm and concave end parts having a depth of 15 μm formed adjacent to the opposite edges of the above-indicated long sides of the window, respectively. Then, as shown in FIG. 11(b), the lower electrode and P/E layer were formed on the convex central part of each of the diaphragm portions, in the same manner as in EXAMPLE 1. By firing of the lower electrode and P/E layer, the convex central part of the diaphragm portion on which the lower electrode and P/E layer were formed was downwardly curved toward the window, while the concave parts of the diaphragm portion on which the lower electrode and P/E layer were not formed maintained the original concave shape, so as to function as the stress releasing sections each having a curved concave shape. The upper electrode was formed on each of the fired P/E layers, whereby a P/E film element constructed according to the present invention was produced.

The thus obtained film element was subjected to polarization treatment as in EXAMPLE 1, and the ratio of the displacement amount upon actuation of all the P/E units (simultaneous actuation) to the displacement amount upon actuation of a single P/E unit (single actuation) was obtained as in EXAMPLE 1. The results showed that the above-indicated ratio was 90% in the present film element with the diaphragm portions each of which has the concave stress releasing sections formed on the opposite sides of the corresponding P/E unit. Thus, it was recognized that the stress releasing sections having the concave shape formed as described above were effective to prevent the considerable reduction in the amount of displacement conventionally experienced when the two or more P/E units are actuated at the same time. The results also showed that the average value of the displacement amounts measured when all the P/E units were actuated at different times was 0.20 μm.

What is claimed is:

1. A piezoelectric/electrostrictive film element, comprising:

a ceramic substrate including a base portion having at least one window, and a diaphragm portion formed as an integral part of said base portion and closing each of said at least one window;

a film-like piezoelectric/electrostrictive unit including a lower electrode, a piezoelectric/electrostrictive layer and an upper electrode, which are formed in the order of description on an outer surface of said diaphragm portion by a film-forming process;

said piezoelectric/electrostrictive unit being disposed on said diaphragm Portion such that at least one of opposite end faces of said piezoelectric/electrostrictive unit is spaced apart from a corresponding one of opposite portions of a periphery of said each window in a direction toward a center of said diaphragm portion;

a stress releasing section constituted by each of at least one of opposite end parts of said diaphragm portion which is located between said at least one of the opposite end faces of said piezoelectric/electrostrictive unit and the corresponding at least one of the opposite portions of the periphery of said each window, said stress releasing section being curved with respect to a plane which includes a major surface of said base portion at which said each window is closed by said diaphragm portion, wherein said opposite portions of said periphery of said each window are opposed to each other in a direction parallel to a straight line which is parallel to said plane of said major surface of said base portion and passes through a center of said each window and along which said each window has a shortest dimension, a dimension of said stress releasing section as measured in said direction being not greater than 40% of said shortest dimension of said each window.

2. A piezoelectric/electrostrictive film element, comprising:

a ceramic substrate including a base portion having at least one window, and a diaphragm portion formed as an integral part of said base portion and closing each of said at least one window;

a film-like piezoelectric/electrostrictive unit including a lower electrode, a piezoelectric/electrostrictive layer and an upper electrode, which are formed in the order of description on an outer surface of said diaphragm portion by a film-forming process;

said piezoelectric/electrostrictive unit being disposed on said diaphragm portion such that at least one of opposite end faces of said piezoelectric/electrostrictive unit is spaced apart from a corresponding one of opposite portions of a periphery of said each window in a direction toward a center of said diaphragm portion;

a stress releasing section constituted by each of at least one of opposite end Parts of said diaphragm portion which is located between said at least one of the opposite end faces of said piezoelectric/electrostrictive unit and the corresponding at least one of the opposite portions of the periphery of said each window, said stress releasing section being curved with respect to a plane which includes a major surface of said base portion at which said each window is closed by said diaphragm portion, wherein said piezoelectric/electrostrictive unit is disposed such that only one of said opposite end faces of said piezoelectric/electrostrictive unit is spaced apart from the corresponding one of said opposite portions of the periphery of said each window in the direction toward the center of said diaphragm portion, said stress releasing section being provided at only one of said opposite end parts of said diaphragm portion located between said one of the opposite end faces of said piezoelectric/electrostrictive unit and said corresponding one of said opposite portions of said periphery of said each window.

3. A piezoelectric/electrostrictive film element, comprising:

a ceramic substrate including a base portion having at least one window, and a diaphragm portion formed as an integral part of said base portion and closing each of said at least one window;

a film-like piezoelectric/electrostrictive unit including a lower electrode, a piezoelectric/electrostrictive layer and an upper electrode, which are formed in the order of description on an outer surface of said diaphragm portion by a film-forming process;

said piezoelectric/electrostrictive unit being disposed on said diaphragm portion such that at least one of opposite end faces of said piezoelectric/electrostrictive unit is spaced apart from a corresponding one of opposite portions of a periphery of said each window in a direction toward a center of said diaphragm portion;

a stress releasing section constituted by each of at least one of opposite end parts of said diaphragm portion which is located between said at least one of the opposite end faces of said piezoelectric/electrostrictive unit and the corresponding at least one of the opposite portions of the periphery of said each window, said stress releasing section being curved with respect to a plane which includes a major surface of said base portion at which said each window is closed by said diaphragm portion, wherein said piezoelectric/electrostrictive unit is disposed such that both of said opposite end faces of said piezoelectric/electrostrictive unit are spaced apart from the corresponding opposite portions of the periphery of said each window in the direction toward the center of said diaphragm portion, said stress releasing section being provided at each of said opposite end parts of said diaphragm portion located between said opposite end faces of said piezoelectric/electrostrictive unit and the corresponding opposite portions of the periphery of said each window, and said stress releasing section provided at each of said opposite end parts of said diaphragm portion has an upwardly convex shape, protruding from said plane in a direction away from said each window, said diaphragm portion including a central part on which said piezoelectric/electrostrictive unit is formed, said central part having a downwardly concave shape, protruding from said plane in a direction toward said each window.

4. A piezoelectric/electrostrictive film element according to claim 2, wherein said stress releasing section provided at only one of said opposite end parts of said diaphragm portion has an upwardly convex shape, protruding from said plane in a direction away from said each window, a part of said diaphragm portion which includes the other of said opposite end parts and on which said piezoelectric/electrostrictive unit is formed having a downwardly concave shape, protruding from said plane in a direction toward said each window.

5. A piezoelectric/electrostrictive film element, comprising:

a ceramic substrate including a base portion having at least one window, and a diaphragm portion formed as an integral part of said base portion and closing each of said at least one window;

a film-like piezoelectric/electrostrictive unit including a lower electrode, a piezoelectric/electrostrictive layer and an upper electrode, which are formed in the order of description on an outer surface of said diaphragm portion by a film-forming process;

said piezoelectric/electrostrictive unit being disposed on said diaphragm portion such that at least one of opposite end faces of said piezoelectric/electrostrictive unit is spaced apart from a corresponding one of opposite portions of a periphery of said each window in a direction toward a center of said diaphragm portion;

a stress releasing section constituted by each of at least one of opposite end parts of said diaphragm portion which is located between said at least one of the opposite end faces of said piezoelectric/electrostrictive unit and the corresponding at least one of the opposite portions of the periphery of said each window, said stress releasing section being curved with respect to a plane which includes a major surface of said base portion at which said each window is closed by said diaphragm portion, wherein said stress releasing section has an upwardly convex shape, protruding from said plane in a direction away from said each window, and said ceramic substrate comprises a diaphragm plate which includes said diaphragm portion and which is formed on said major surface of said base portion such that said diaphragm portion closes said each window, said upwardly convex shape of said stress releasing section having a height not greater than twice a thickness of said diaphragm portion, said height being measured from one of opposite major surfaces of said diaphragm plate which is remote from said base portion.

6. A piezoelectric/electrostrictive film element, comprising:
- a ceramic substrate including a base portion having at least one window, and a diaphragm portion formed as an integral part of said base portion and closing each of said at least one window;
- a film-like piezoelectric/electrostrictive unit including a lower electrode, a piezoelectric/electrostrictive layer and an upper electrode, which are formed in the order of description on an outer surface of said diaphragm portion by a film-forming process;
- said piezoelectric/electrostrictive unit being disposed on said diaphragm portion such that at least one of opposite end faces of said piezoelectric/electrostrictive unit is spaced apart from a corresponding one of opposite portions of a periphery of said each window in a direction toward a center of said diaphragm portion;
- a stress releasing section constituted by each of at least one of opposite end parts of said diaphragm portion which is located between said at least one of the opposite end faces of said piezoelectric/electrostrictive unit and the corresponding at least one of the opposite portions of the periphery of said each window, said stress releasing section being curved with respect to a plane which includes a major surface of said base portion at which said each window is closed by said diaphragm portion, wherein said stress releasing section has a downwardly concave share, protruding in a direction toward said each window, and said ceramic substrate comprises a diaphragm plate which includes said diaphragm portion and which is formed on said major surface of said base portion such that said diaphragm portion closes said each window, said downwardly concave shape of said stress releasing section having a height not greater than twice a thickness of said diaphragm portion, said height being measured from one of opposite major surfaces of said diaphragm plate which is remote from said base portion.

\* \* \* \* \*